(12) United States Patent
Kahng et al.

(10) Patent No.: US 7,728,381 B2
(45) Date of Patent: Jun. 1, 2010

(54) SEMICONDUCTOR DEVICE AND METHOD OF FABRICATING THE SAME

(75) Inventors: Jae-Rok Kahng, Seoul (KR); Makoto Yoshida, Gyeonggi-do (KR); Se-Myeong Jang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 455 days.

(21) Appl. No.: 11/697,641

(22) Filed: Apr. 6, 2007

(65) Prior Publication Data
US 2007/0235785 A1    Oct. 11, 2007

(30) Foreign Application Priority Data
Apr. 6, 2006    (KR) .................. 10-2006-0031489

(51) Int. Cl.
*H01L 27/088* (2006.01)
(52) U.S. Cl. .................. 257/330; 257/E29.273
(58) Field of Classification Search .......... 257/330, 257/E29.273, E29.274, E29.275
See application file for complete search history.

(56) References Cited

U.S. PATENT DOCUMENTS

| 6,815,277 B2 | 11/2004 | Fried et al. |
| 6,888,187 B2 | 5/2005 | Brown et al. |
| 6,888,199 B2 | 5/2005 | Nowak et al. |
| 7,396,775 B2 * | 7/2008 | Lee .................. 438/761 |

FOREIGN PATENT DOCUMENTS

JP    2005-019996    1/2005

OTHER PUBLICATIONS

English language abstract of Japanese Publication No. 2005-019996.
* cited by examiner

*Primary Examiner*—Jerome Jackson, Jr.
*Assistant Examiner*—Paul A Budd
(74) *Attorney, Agent, or Firm*—Stanzione & Kim, LLP

(57) ABSTRACT

A semiconductor device is fabricating using a photoresist mask pattern, and selectively removing portions of a liner nitride layer in a cell region and a peripheral circuit region. A modified FinFET is formed to reduce the influence of signals transmitted by adjacent gate lines in a cell region. A double FinFET and a substantially planar MOSFET are formed in a core region and in a peripheral region, respectively, concurrently with the formation of the modified FinFET.

13 Claims, 28 Drawing Sheets

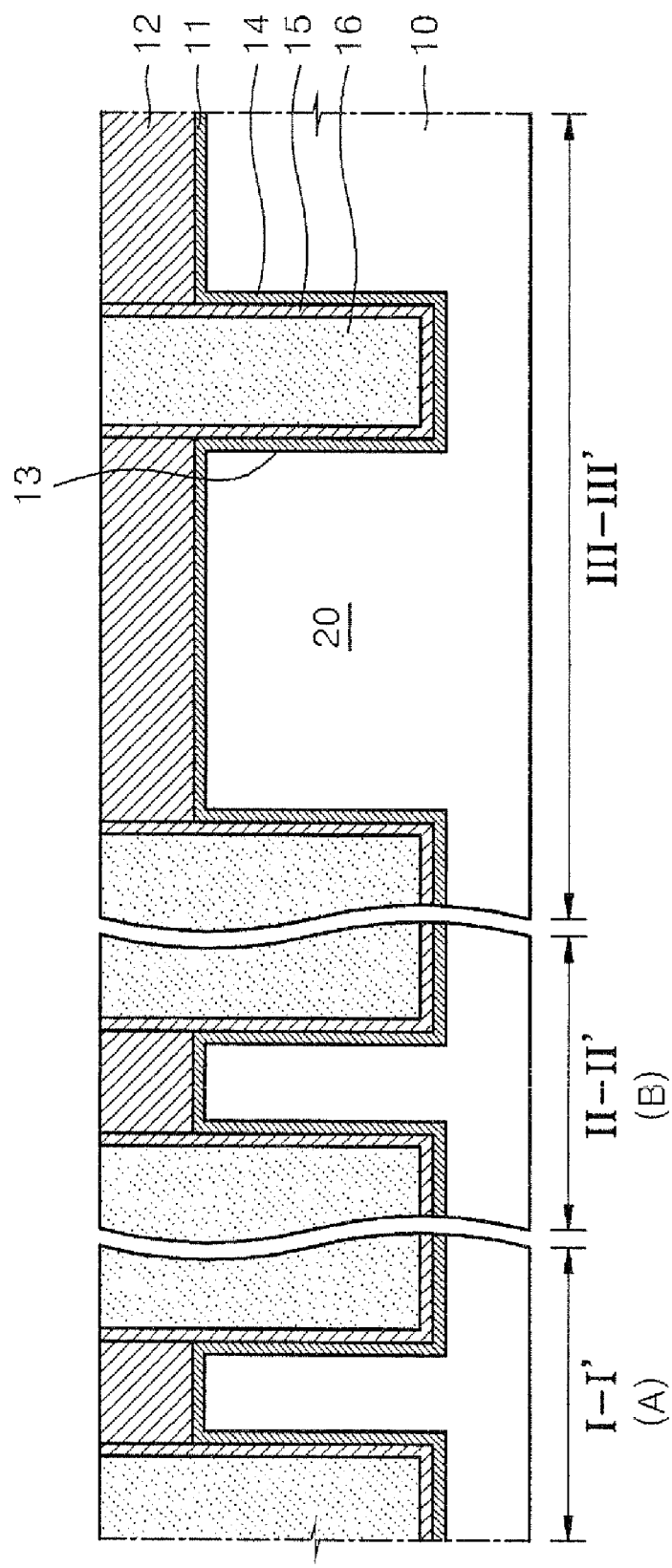

US 7,728,381 B2

SEMICONDUCTOR DEVICE AND METHOD OF FABRICATING THE SAME

CROSS-REFERENCE TO RELATED PATENT APPLICATION

This application claims the benefit of foreign priority to Korean Patent Application No. 10-2006-0031489, filed on Apr. 6, 2006, the disclosure of which is incorporated herein in its entirety by reference.

BACKGROUND

1. Field of Invention

Embodiments exemplarily described herein relate to semiconductor devices and methods of fabricating semiconductor devices, and more particularly to a method of fabricating FinFET devices.

2. Description of the Related Art

In the semiconductor manufacturing industry, efforts are continuously made to reduce the size of semiconductor devices. As the size of semiconductor devices decrease, the degree to which the semiconductor devices can be integrated together improves and the production yield increases. The performance of semiconductor devices desirably improves, in terms of reduced power consumption of the semiconductor device, as semiconductor devices decrease in size.

Undesirably, however, the length of channels in semiconductor devices (e.g., CMOS devices) can be shortened as the size of the semiconductor device decreases. If the channel length is excessively shortened, a short channel effect can occur, thereby decreasing semiconductor device performance. Drain induced barrier lowering (DIBL) is a typical short channel effect, and a potential barrier between the drain and source regions as the channel length is shortened. As a drain voltage increases, a depletion region around the drain region increases and an electric field of the drain region reduces a channel potential barrier so that an off-state of the semiconductor device increases or a leakage current between the source and drain regions increases.

In order to overcome the limitations described above a three-dimensional FinFETs have been developed.

FIG. 1 is a perspective view illustrating a structure of a conventional FinFET.

Referring to FIG. 1, a gate electrode 5 covers three surfaces of a fin-shaped active region 2 of a semiconductor substrate 1. A gate dielectric layer 4 is disposed between the gate electrode 5 and the fin-shaped active region 2. An isolation layer (not shown) is also provided. As shown, the conventional FinFET structure is an extending multi-gate structure and may allow improved gate control.

FIG. 2 is an enlarged longitudinal sectional view of the fin-shaped active region 2 shown in FIG. 1.

Referring to FIG. 2, gate lines 5a are formed over the fin-shaped active region 2 and the gate lines 5b extend down into an isolation layer 3 so as to contact sidewalls of the fin-shaped active region 2. As the size of the semiconductor device decreases, a distance between the gate lines 5a and 5b is reduced. In the event that a misalignment occurs, a gate line (e.g., gate line 5b), which should not otherwise contact the fin-shaped active region 2, contacts the sidewall of the active region 2 or is formed on the active region 2. Thus, when the portion of the gate line 5b penetrating the isolation layer 3 contacts the sidewall of the active region 2 as shown in FIG. 2, the transistor formed on the active region 2 will be undesirably influenced by a signal transmitted by gate line 5b.

Often, both a FinFET and a planar MOSFET are formed together to improve an integration density of a semiconductor device. For example, a FinFET is formed in a cell region of a semiconductor device while a planar MOSFET is formed in a peripheral region of the semiconductor device. Furthermore, multiple FinFET structures may be fabricated in a semiconductor device, causing an upper surface of an active region to be uneven. Because the upper surface of the active region is uneven, the FinFET and planar MOSFET structures must be formed in the cell and peripheral regions, respectively, using separate masks. When separate masks are used to form FinFET and planar MOSFET structures, fabrication processes for the resultant semiconductor device can become undesirably complicated.

SUMMARY

Embodiments exemplarily described herein provide a semiconductor device, in which a FinFET is formed in a cell region of the semiconductor device so as to not be influenced by a signal of an adjacent gate line, a double FinFET having an uneven upper surface is formed in a cell region of the semiconductor device, and a MOSFET having a substantially planar profile is formed in a peripheral region of the semiconductor device.

Embodiments exemplarily described herein also provide a method of fabricating a semiconductor device by concurrently forming a FinFET in a cell region of the semiconductor device so as to not be influenced by signals transmitted by adjacent gate lines, a double FinFET having an uneven upper surface in a core region of the semiconductor device, and a MOSFET having a substantially planar profile in a peripheral region of the semiconductor device.

One embodiment exemplarily described herein can be characterized as a semiconductor device that includes a substrate having first, second and third device regions; an isolation layer defining first, second and third active regions within the first, second and third device regions, respectively; and first, second and third gate structures extending over the first, second and third active regions, respectively, wherein the first gate structure is disposed between at least one first side surface of the first active region and the isolation layer, wherein the second active region comprises an upper surface having a trench defined therein and at least one second side surface, wherein the second gate structure covers at least a portion of the upper surface of the second active region and is disposed between the at least one second side surface and the isolation layer, and wherein the third gate structure is disposed on an upper surface of the third gate structure.

Another embodiment exemplarily described herein can be characterized as a semiconductor device that includes a substrate comprising a first device region and a second device region; an isolation structure within the substrate; a first active region within the first device region and a second active region within the second device region, wherein the first and second active regions are defined by the isolation structure; and a plurality of gate structures extending over the first and second active regions and the isolation structure in the first and second device regions, wherein a first portion of the first active region is a fin-shaped active region and the second active region comprises a substantially planar active region, and wherein upper surfaces of the first and second active regions are substantially coplanar with an upper surface of the isolation structure.

Yet another embodiment exemplarily described herein can be characterized as a semiconductor device that includes an isolation structure within a substrate, the isolation structure defining an active region, wherein a first portion of the active region comprises a fin-shaped active region and a second portion of the first active region comprises a substantially planar active region.

Still another embodiment exemplarily described herein can be characterized as a method of fabricating a semiconductor device that includes forming an isolation layer on a substrate, the isolation layer defining a plurality of active regions; forming first, second and third device regions on the substrate, the first, second and third device regions comprising a first, second and third active region, respectively; forming first, second and third gate structures extending over the first, second and third active regions, respectively, wherein the first gate structure is disposed between at least one first side surface of the first active region and the isolation layer, wherein the second active region comprises an upper surface having a trench defined therein and at least one second side surface, wherein the second gate structure covers at least a portion of the upper surface of the second active region and is disposed between the at least one second side surface and the isolation layer, and wherein the third gate structure is disposed on an upper surface of the third gate structure.

Yet another embodiment exemplarily described herein can be characterized as a method of fabricating a semiconductor device that includes providing a substrate having a first device region and a second device region; forming an isolation structure within the substrate; forming a first active region within the first device region and a second active region within the second device region, wherein the first and second active regions are defined by the isolation structure; and forming a plurality of gate structures extending over the first and second active regions and the isolation structure in the first and second device regions, wherein a first portion of the first active region is a fin-shaped active region and the second active region comprises a substantially planar active region, and wherein upper surfaces of the first and second active regions are substantially coplanar with an upper surface of the isolation structure.

Another embodiment exemplarily described herein can be characterized as a method of fabricating a semiconductor device that includes providing a substrate having a first device region and a second device region; forming an isolation structure within the substrate, wherein a portion of the isolation structure in the first device region has a first arrangement of insulation material and a portion of the isolation structure in the second device region has a second arrangement of insulation material different from the first arrangement of insulation material; subjecting the portions of the isolation structure within the first and second device regions to substantially the same etching conditions to form a first active region within the first device region and a second active region within the second device region, wherein the first and second active regions are defined by the isolation structure, wherein a first portion of the first active region is a fin-shaped active region and the second active region comprises a substantially planar active region.

BRIEF DESCRIPTION OF THE DRAWINGS

The above and other features and advantages of the present invention will become more apparent by describing in detail exemplary embodiments thereof with reference to the attached drawings in which:

FIGS. 6A, 7A, 8A, 9A, 10A, 11A, 12A, 13A, 14A, 15A, 16A and 17A are sectional views illustrating one embodiment of a method of forming a cell region of a semiconductor device;

DETAILED DESCRIPTION OF THE ILLUSTRATED EMBODIMENTS

Figure 1:
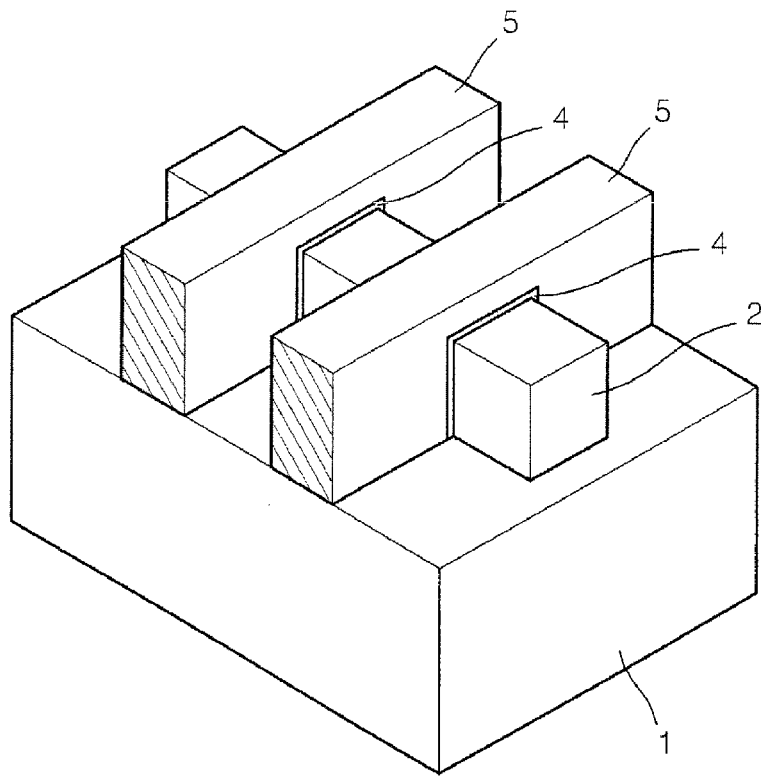
FIG. 1 is a perspective view illustrating a structure of a conventional FinFET structure.
Figure 2:
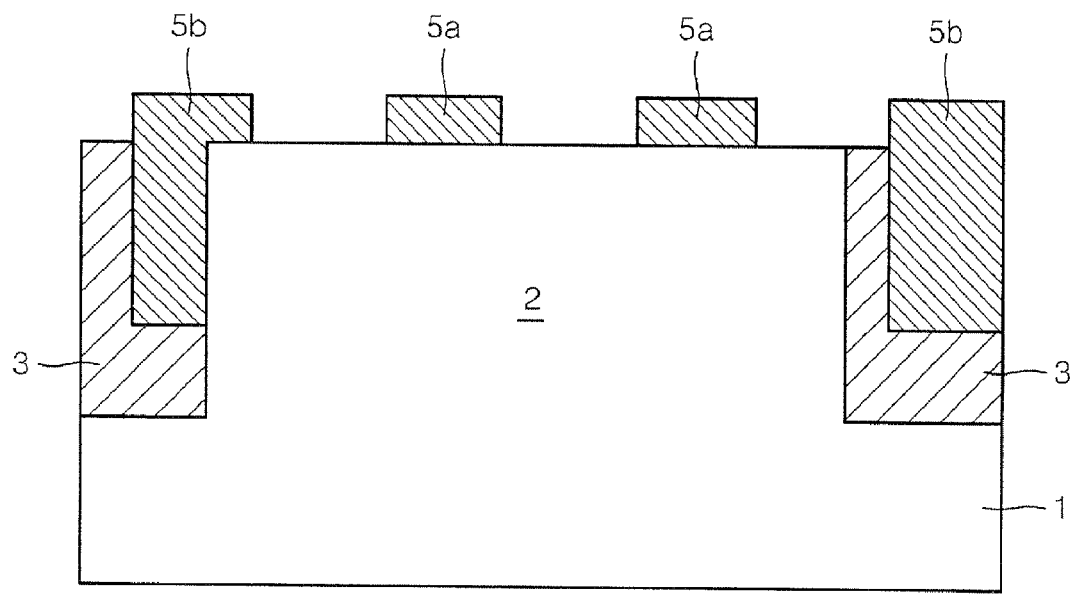
FIG. 2 is a longitudinal sectional view of a fin-shaped active region shown in FIG. 1.

Exemplary embodiments of the present invention will now be described more fully hereinafter with reference to the accompanying drawings. The embodiments may, however, be realized in many different forms and should not be construed as being limited to the embodiments specifically set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

In the description that follows, a substantially planar active region can be generally characterized as having essentially one surface (e.g., the upper surface of the substrate) that is in electrical communication with a gate structure whereas a fin-shaped active region can be generally characterized as including an upper surface and a side surface that are both in electrical communication with a gate structure. Further, a double fin-shaped active region may be a fin-shaped active region that further includes a recess or trench formed within the upper surface thereof. Because a double fin-shaped active region has a recess or trench formed within the upper surface thereof, the contact area of a gate structure formed over a double fin-shaped active region can be greater than a contact area of a gate structure formed over a fin-shaped active region.

Figure 3A:
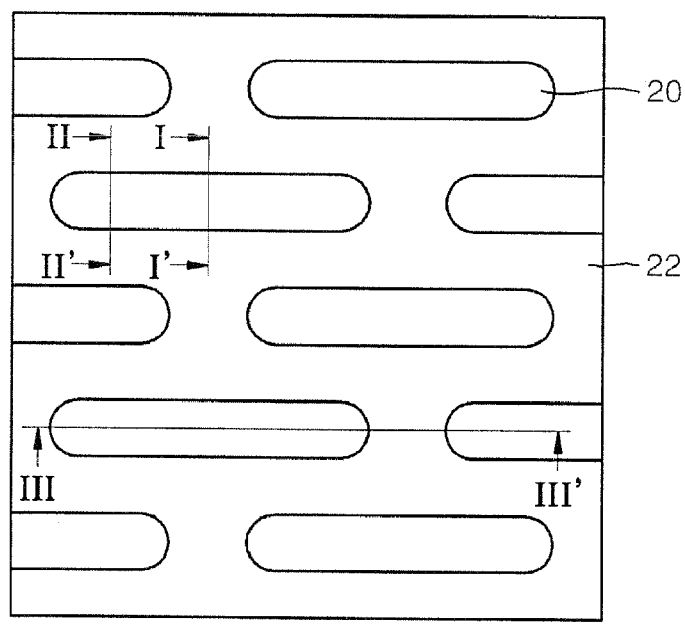
FIG. 3A is a plan view illustrating one embodiment of a layout of active regions in a cell region of a semiconductor device.

FIG. 3A is a plan view illustrating one embodiment of a layout of active regions in a cell region of a semiconductor device.

Referring to FIG. 3A, an active region 20 has a bar shape and an isolation region 22 isolates the active regions 20. Line I-I' indicates a short axis of a portion of the active region where a fin is formed, line II-II' indicates a short axis of a portion of the active region where a fin is not formed and line III-III' indicates a longitudinal axis of portions of the active region where the fin both is and is not formed.

Figure 3B:
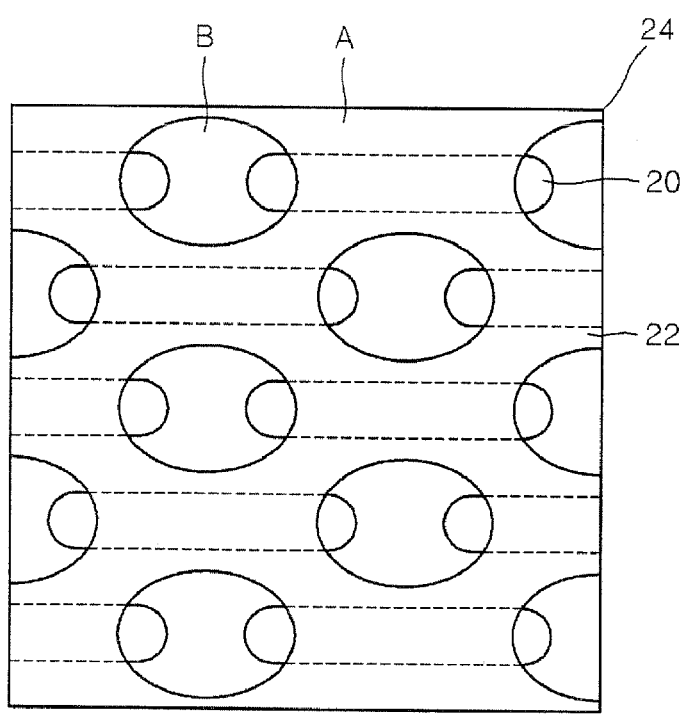
FIG. 3B is a plan view illustrating one embodiment in which the active regions shown in FIG. 3A are provided as both fin-shaped active regions and substantially planar active regions.

FIG. 3B is a plan view illustrating one embodiment in which the active regions shown in FIG. 3A are provided as both fin-shaped active regions and substantially planar active regions.

Referring to FIG. 3B, the region indicated at "A" is covered by the photoresist pattern 24 and represents a region where a fin-shaped active region is to be formed. The region indicated at "B" is exposed by the photoresist pattern 24 and represents a region where a substantially planar active region is to be formed.

Figure 4A:
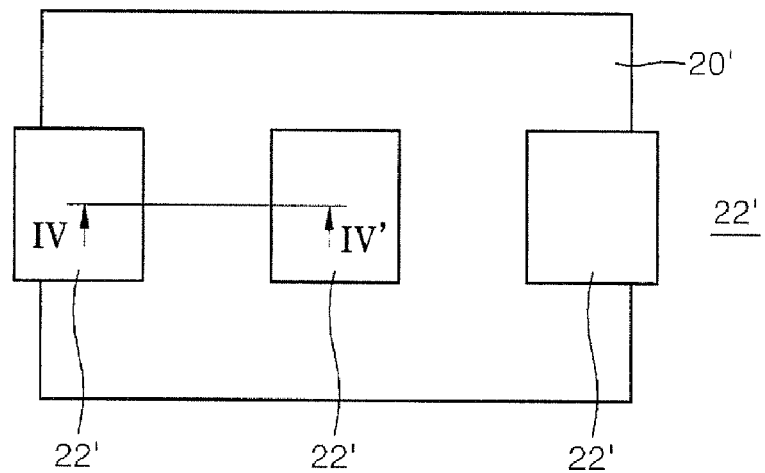
FIG. 4A is a plan view illustrating one embodiment of a pattern of an active region in a core region of a semiconductor device.

FIG. 4A is a plan view illustrating one embodiment of a pattern of an active region in a core region of a semiconductor device. Referring to FIG. 4A, an isolation region 22' is formed inside and outside an active region 20'.

Figure 4B:
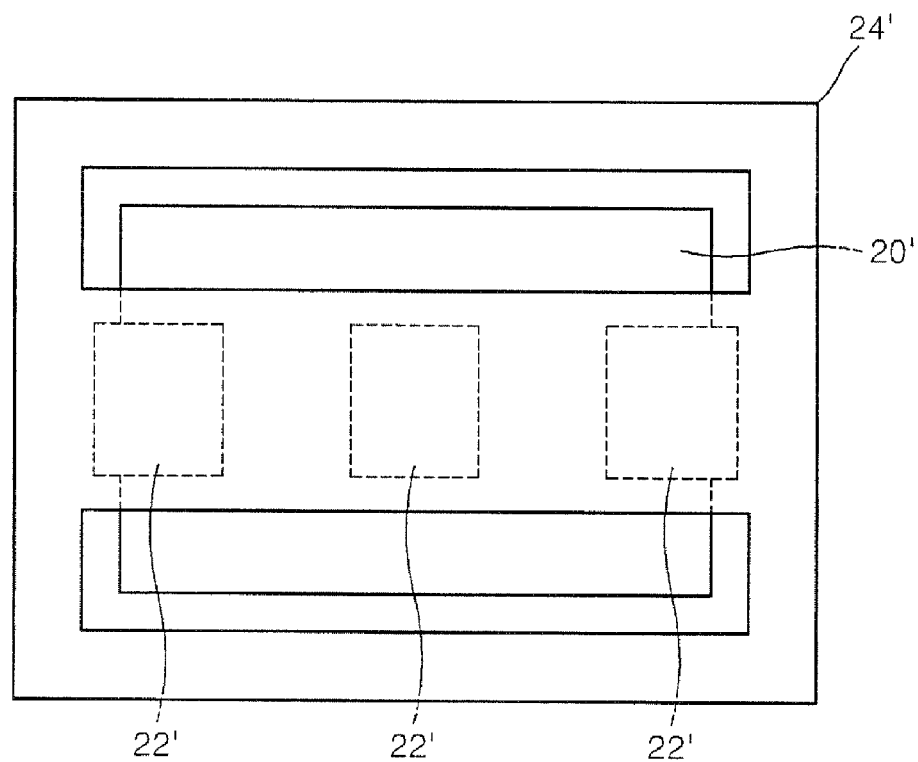
FIG. 4B is a plan view illustrating one embodiment in which the active region shown in FIG. 4A is provided as a double fin-shaped active region.

FIG. 4B is a plan view illustrating one embodiment in which the active region shown in FIG. 4A is provided as a double fin-shaped active region.

Referring to FIG. 4B, the photoresist pattern 24' can be formed concurrently with the photoresist pattern 24 shown in FIG. 3B. In one embodiment, a double fin is formed at the portion of the active region 20' covered by the photoresist pattern 24' while the portion of the active region 20' exposed by the photoresist pattern 24' is a substantially planar active region.

Figure 5A:
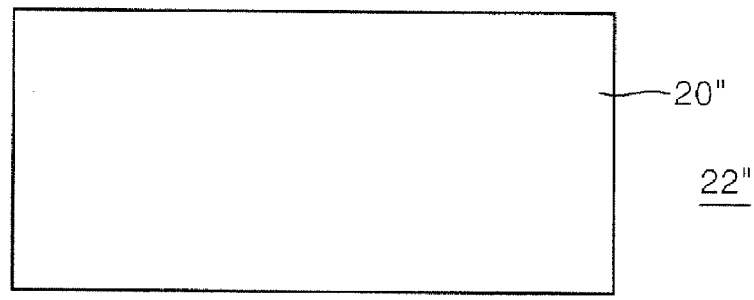
FIG. 5A is a plan view illustrating one embodiment of a pattern of an active region in a peripheral region of a semiconductor device.

FIG. 5A is a plan view illustrating one embodiment of a pattern of an active region in a peripheral region of a semiconductor device.

Referring to FIG. 5A, an active region 20" in the peripheral region can have a substantially rectangular shape, wherein an isolation region 22" is formed outside the active region 20".

Figure 5B:
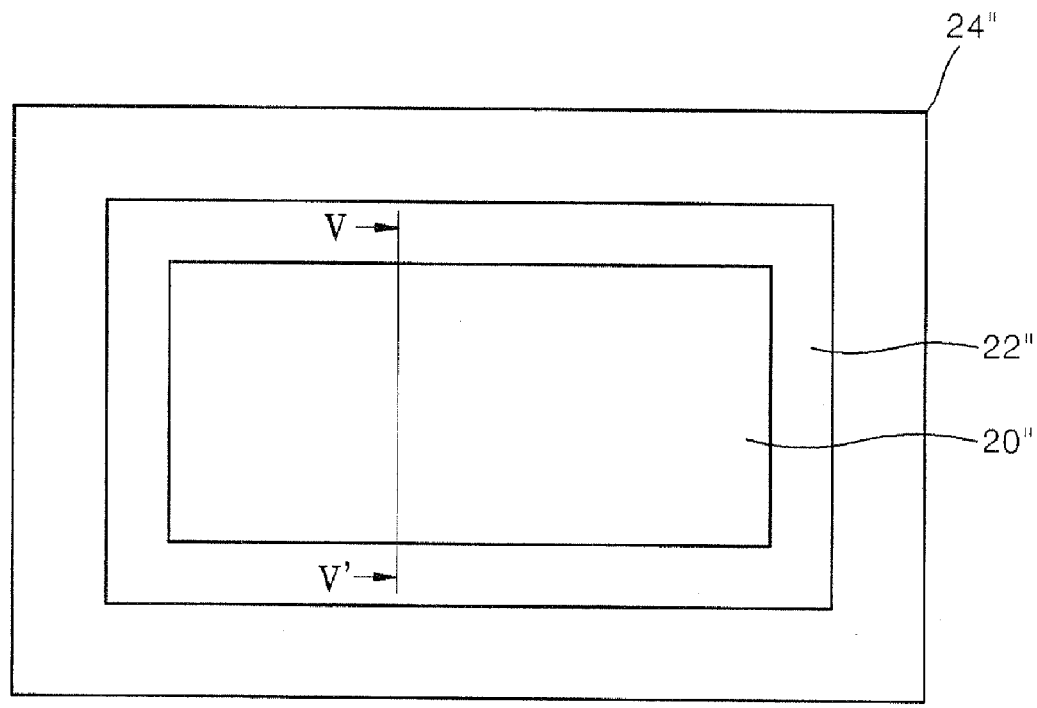
FIG. 5B is a plan view illustrating one embodiment in which the active region shown in FIG. 5A is provided as a substantially planar active region.

FIG. 5B is a plan view illustrating one embodiment in which the active region shown in FIG. 5A is provided as a substantially planar active region.

Referring to FIG. 5B, the photoresist pattern 24" can be formed concurrently with the photoresist patterns 24 and 24' shown in FIGS. 3B and 4B, respectively. As illustrated, the active region 20" and the isolation region 22" around the active region 20" are exposed by the photoresist pattern 24" so that the active region 20" is a substantially planar active region.

FIGS. 6A, 7A, 8A, 9A, 10A, 11A, 12A, 13A, 14A, 15A, 16A and 17A are sectional views illustrating one embodiment of a method of forming a cell region of a semiconductor device, taken along lines I-I', II-II', and III-III' illustrated in FIG. 3A.

FIGS. 6B, 7B, 8B, 9B, 10B, 11B, 12B, 13B, 14B, 15B, 16B and 17B are sectional views illustrating one embodiment of a method of forming a core region of a semiconductor device, taken along a line IV-IV' illustrated in FIG. 4A.

FIGS. 6C, 7C, 8C, 9C, 10C, 11C, 12C, 13C, 14C, 15C, 16C and 17C are sectional views illustrating one embodiment of a method of forming a peripheral region of a semiconductor device, taken along a line V-V' illustrated in FIG. 5A.

In one embodiment, the methods of forming the aforementioned cell, core and peripheral regions as variously illustrated in FIGS. 6A-6C, 7A-7C and so on to 17A-17C may be performed concurrently, as will be described in greater detail below.

Figure 6B:
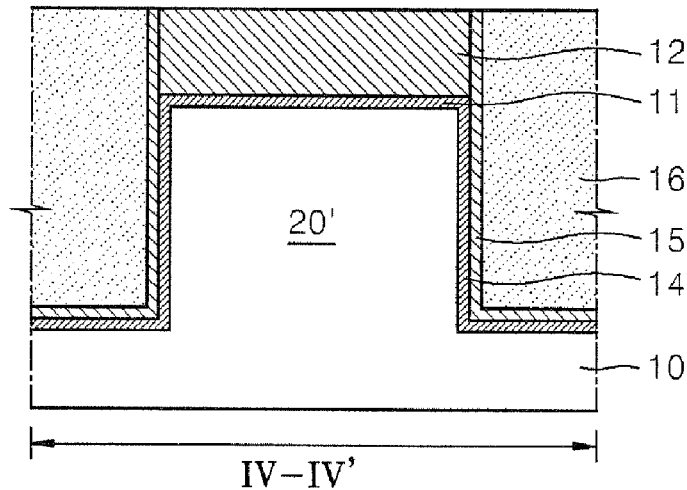
FIGS. 6B, 7B, 8B, 9B, 10B, 11B, 12B, 13B, 14B, 15B, 16B and 17B are sectional views illustrating one embodiment of a method of forming a core region of a semiconductor device.
Figure 6C:
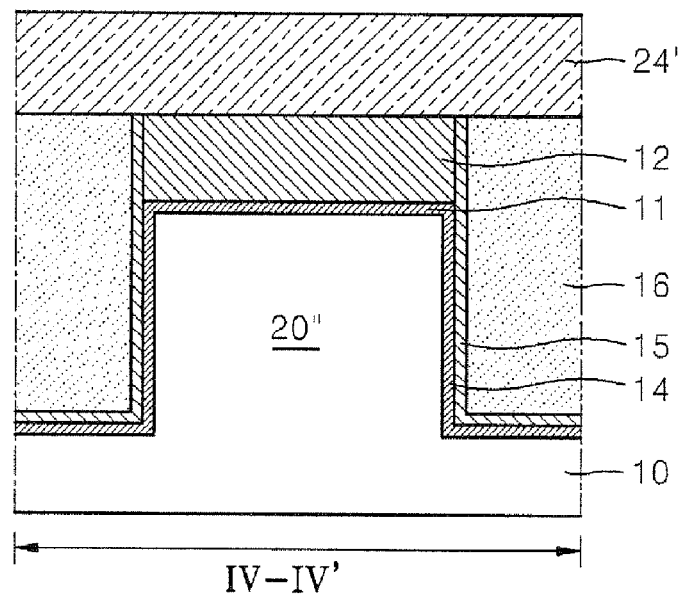
FIGS. 6C, 7C, 8C, 9C, 10C, 11C, 12C, 13C, 14C, 15C, 16C and 17C are sectional views illustrating one embodiment of a method of forming a peripheral region of a semiconductor device.

As shown in FIGS. 6A, 6B, and 6C an isolation oxide layer 16 has been formed in a semiconductor substrate 10 having a trench 13, and a chemical mechanical polishing (CMP) process has been performed on the isolation oxide layer 16 using a mask nitride layer 12 as a stop layer to planarize the isolation oxide layer 16, thereby forming an isolation region.

Describing the processes of FIGS. 6A, 6B, and 6C in more detail, a pad oxide layer 11 and the mask nitride layer 12 are formed on the semiconductor substrate 10 and a photolithography process is performed so as to form a mask nitride layer pattern. The trench 13 is then formed using the mask nitride layer 12 as a mask. A liner oxide layer 14 and a liner nitride layer 15 are subsequently formed over the mask nitride layer 12 and within the trench 13. The isolation oxide layer 16 is formed on the semiconductor substrate 10 so as to completely bury the remaining portion of the liner nitride layer 15 and the trench 13. The isolation oxide layer 16 may include a material such as a high density plasma (HDP) oxide. Then, the isolation oxide layer 16 is subjected to a CMP process using the mask nitride layer 12 as a stop layer and is thereby planarized.

Figure 7A:
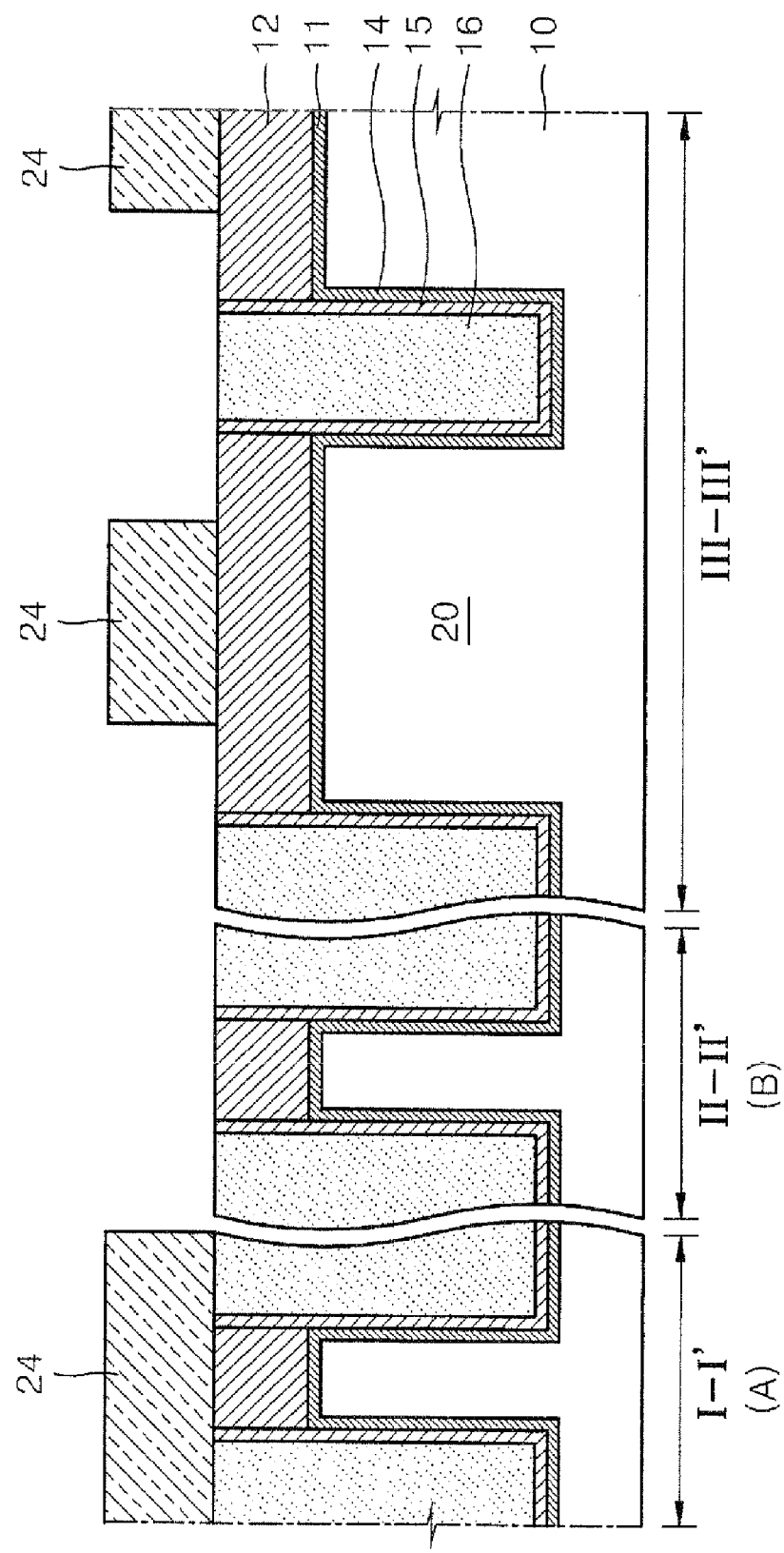

FIG. 7A is a sectional view illustrating the cell region of the semiconductor device on which the photoresist pattern 24 shown in FIG. 3B has been formed after the isolation oxide layer 16 has been planarized.

Referring to FIGS. 3B and 7A, the portion of the mask nitride layer 12 on the active region 20 and the isolation region 22 in the A region (i.e., along line I-I') is covered by the photoresist pattern 24 while the portion of the mask nitride layer 12 on the active region 20 and the isolation region 22 in the B region (i.e., along line II-II') is exposed by the photoresist pattern 24. As shown in FIG. 7A along line III-III', the A region is covered by photoresist pattern 24 and the B region exposed by the photoresist pattern 24.

Figure 7B:
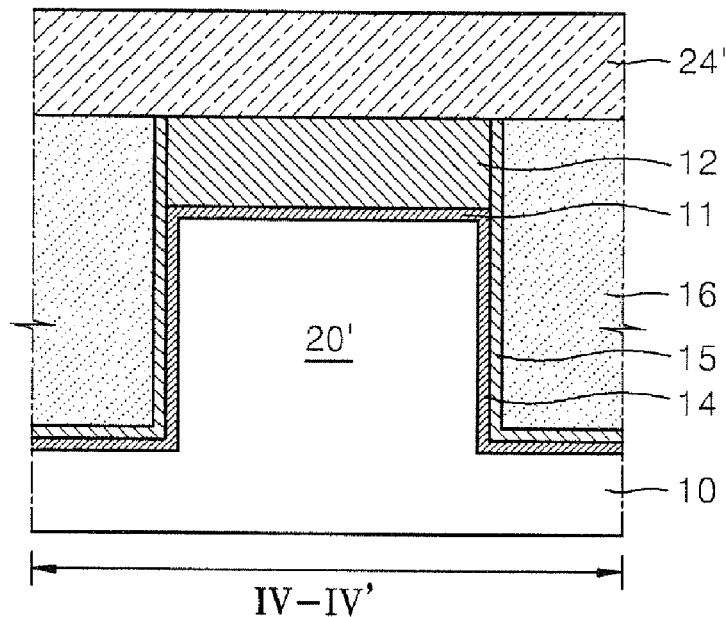
Figure 7C:
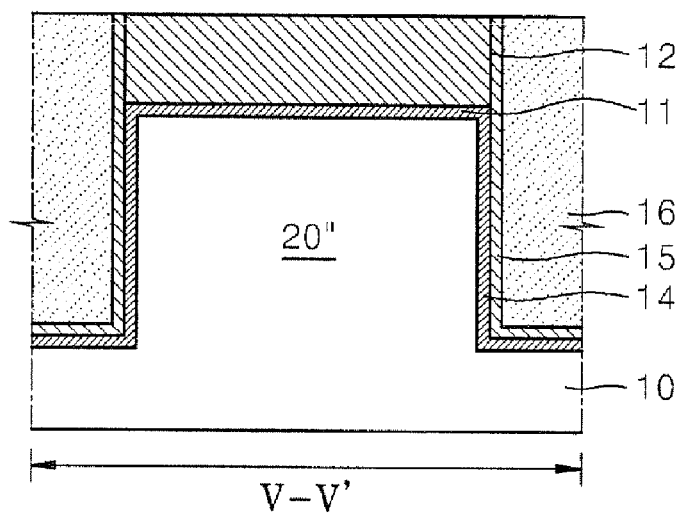

FIG. 7B is a sectional view illustrating the core region of the semiconductor device on which the photoresist pattern 24' illustrated in FIG. 4B has been formed after the isolation oxide layer 16 has been planarized. FIG. 7C is a sectional view illustrating the peripheral region of the semiconductor device on which the photoresist pattern 24" illustrated in FIG. 5B has been formed after the isolation oxide layer 16 has been planarized.

Referring to FIGS. 4B, 5B, 7B and 7C, when the portion of the mask nitride layer 12 on the active region 20' and the adjacent isolation region 22' is covered by the photoresist pattern 24' in the core region, the portion of the mask nitride layer 12 on the active region 20" and the adjacent isolation region 22" is exposed by the photoresist pattern 24" in the peripheral region. In a subsequent process, a fin is formed in the portion of the active region 20' covered by the photoresist pattern 24' in the core region, but only the substantially planar active region 20" is formed in the peripheral region.

Figure 8A:
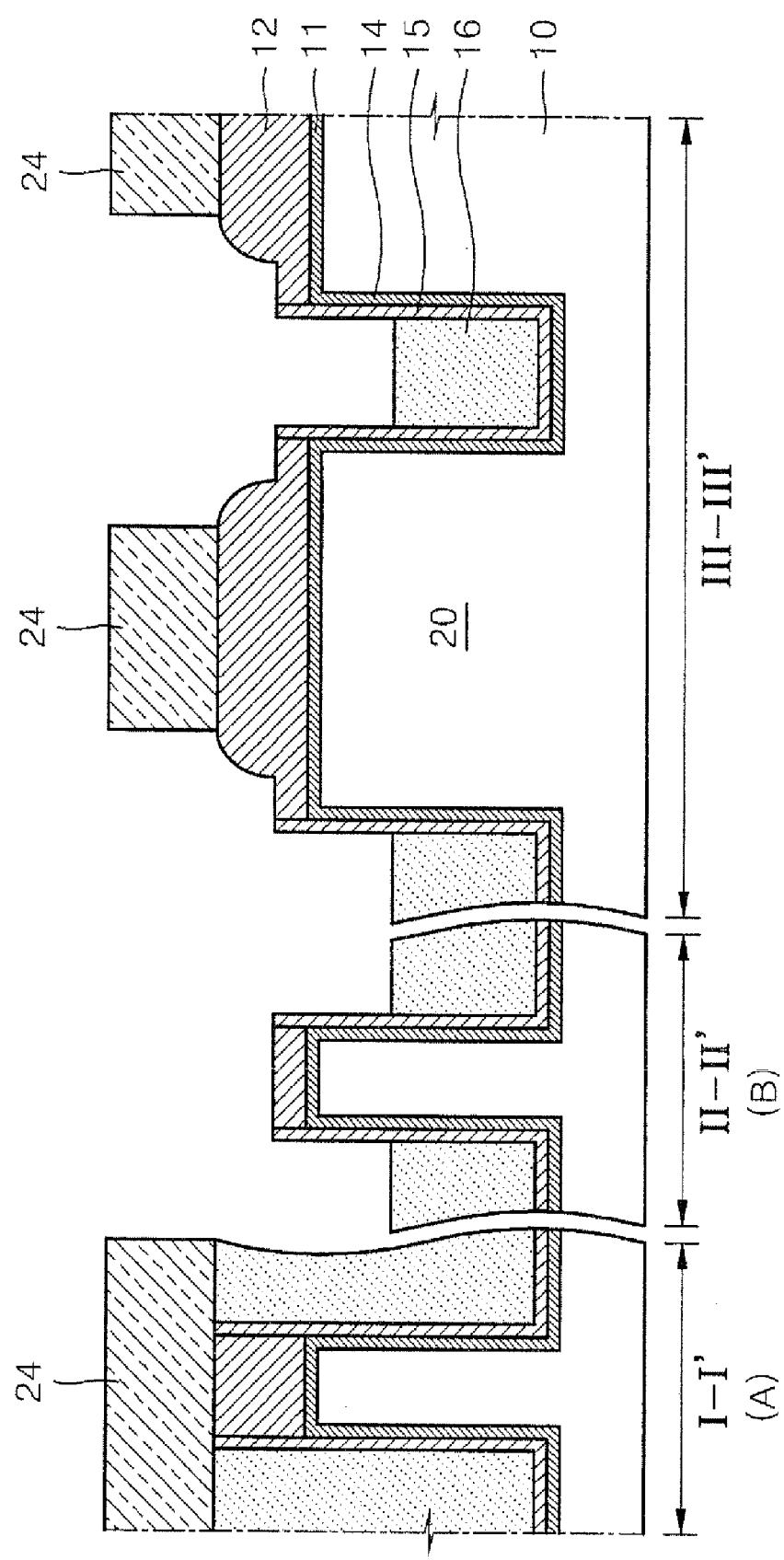

Referring to FIG. 8A, a portion of the isolation oxide layer 16 in the isolation region 22 exposed by the photoresist pattern 24 in region B of FIG. 3B is etched to a predetermined depth and removed. As illustrated, a portion of the mask nitride layer 12 exposed by the photoresist pattern 24 in region B of FIG. 3B may also be etched such that the thickness of the exposed mask nitride layer 12 is reduced. As shown along line III-III', one portion of the mask nitride layer 12 covered by the photoresist pattern 24 in region A of FIG. 3B is protected while another portion of the mask nitride layer 12 that is exposed by the photoresist pattern 24 in region B of FIG. 3B is partially removed such that the thickness of the exposed mask nitride layer 12 is reduced.

Figure 8B:
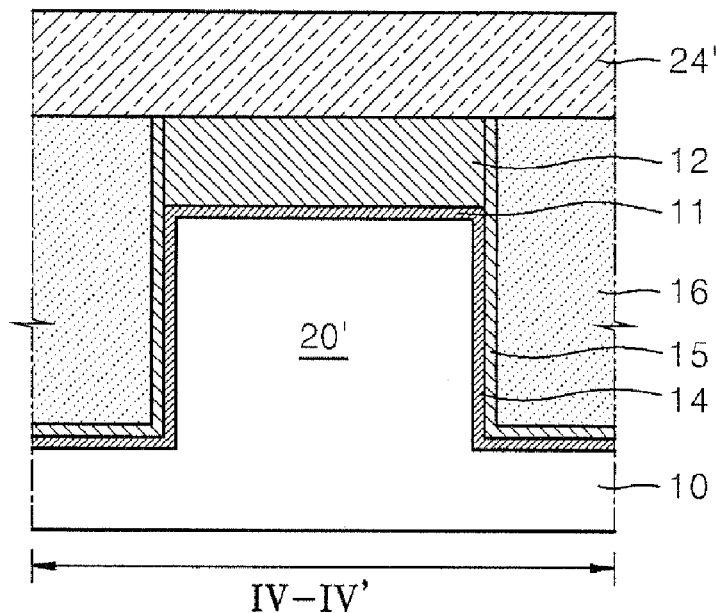
Figure 8C:
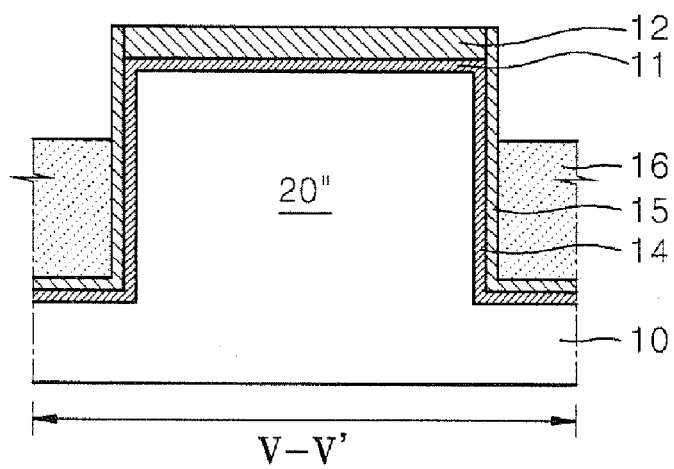

Referring to FIGS. 8B and 8C, both the portion of the mask nitride layer 12 and the portion of the isolation oxide layer 16 in the core region are protected by the photoresist pattern 24' while both the portion of the mask nitride layer 12 and the portion of the isolation oxide layer 16 in the peripheral region are exposed by the photoresist pattern 24" and partially removed such that their respective thicknesses are reduced. Although not shown in FIG. 8B, both a portion of the mask nitride layer 12 on the active region 20' and a portion of the isolation oxide layer 16 in the isolation region 22' adjacent to the active region 20' (i.e., along a boundary between the active region 20' and isolation region 22') in the core region are exposed by the photoresist pattern 24' of FIG. 4B and are both partially removed such that their respective thicknesses are reduced.

Figure 9A:
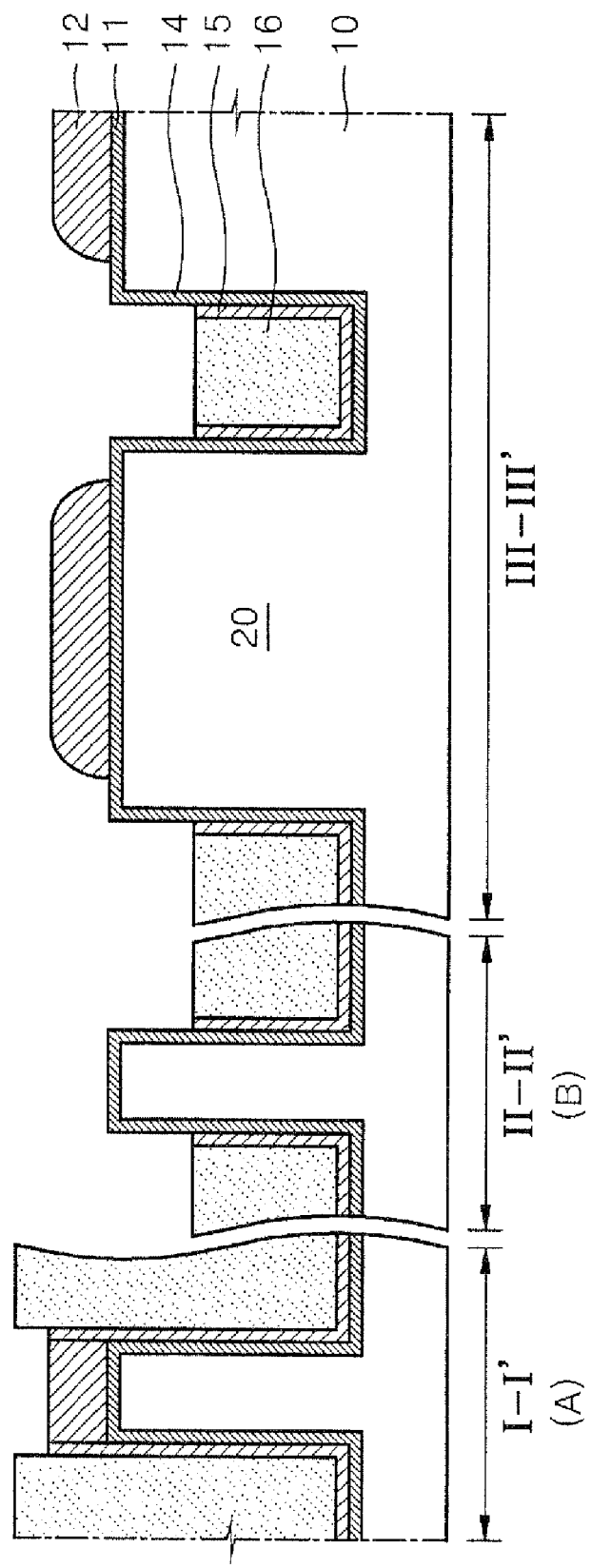
Figure 9B:
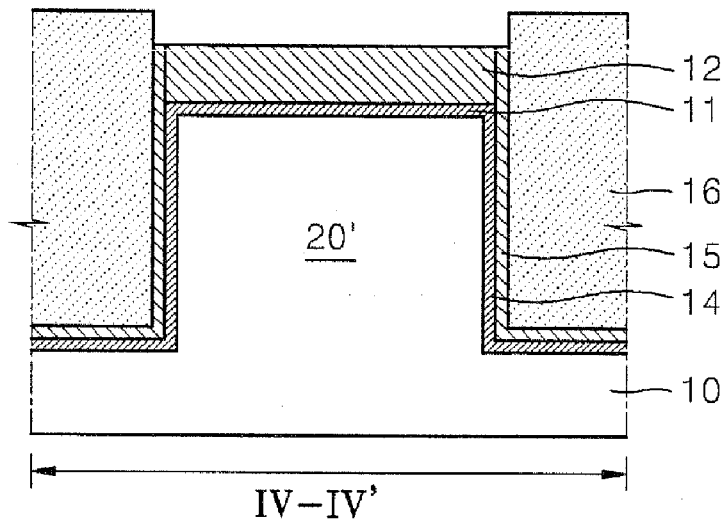
Figure 9C:
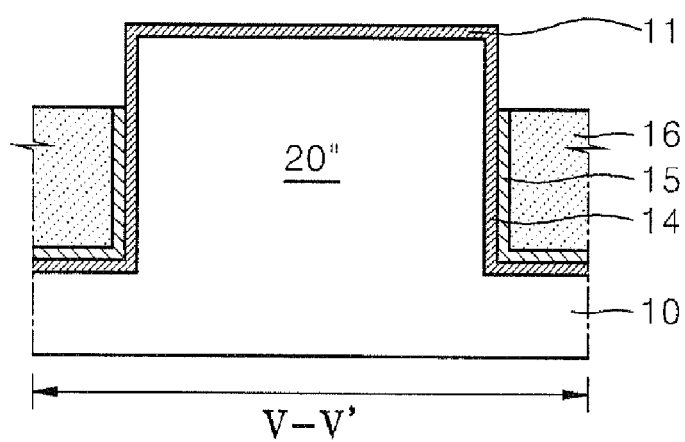

Referring to FIGS. 9A-9C, the photoresist patterns 24, 24' and 24" are removed. As shown in FIG. 9A, the portion of the mask nitride layer 12 having the previously reduced thickness in the B region (i.e., along line II-II') is completely removed and the liner nitride layer 15 is partially removed such that an upper portion of the liner nitride layer 15 is, for example, substantially coplanar with an upper portion of the isolation oxide layer 16 having the previously reduced thickness. In one embodiment, the mask nitride layer 12 and the liner nitride layer 15 may be selectively removed using a phosphoric acid solution. As illustrated, the portion of the mask nitride layer 12 in the A region (i.e., along line I-I') that was previously protected by the photoresist pattern 24 may be also be etched to thickness sufficient to allow the mask nitride layer 12 to adequately function as a stop layer in a subsequent CMP process.

Referring to FIG. 9B, the portion of the mask nitride layer 12 on the active region 20' in the core region (i.e., the portion of the mask nitride layer 12 that was previously protected by the photoresist pattern 24' in FIG. 8B) is partially removed. Although not shown in FIG. 9B, the partially-removed mask nitride layer 12 in the region exposed by the photoresist pattern 24' illustrated in FIG. 4B is completely removed and the liner nitride layer 15 in the region exposed by the photoresist pattern 24' illustrated in FIG. 4B is etched such that an upper portion of the liner nitride layer 15 is substantially coplanar with an upper portion of the adjacent isolation oxide layer 16 having the previously reduced thickness.

Referring to FIG. 9C, the portion of the mask nitride layer 12 in the peripheral region (i.e., the portion of the mask nitride layer 12 that was previously partially removed in the process shown in FIG. 8C) is completely removed and the liner nitride layer 15 is etched such that an upper portion of the liner nitride layer 15 is, for example, substantially coplanar with an upper portion of the adjacent isolation oxide layer 16 having the previously reduced thickness.

Figure 10A:
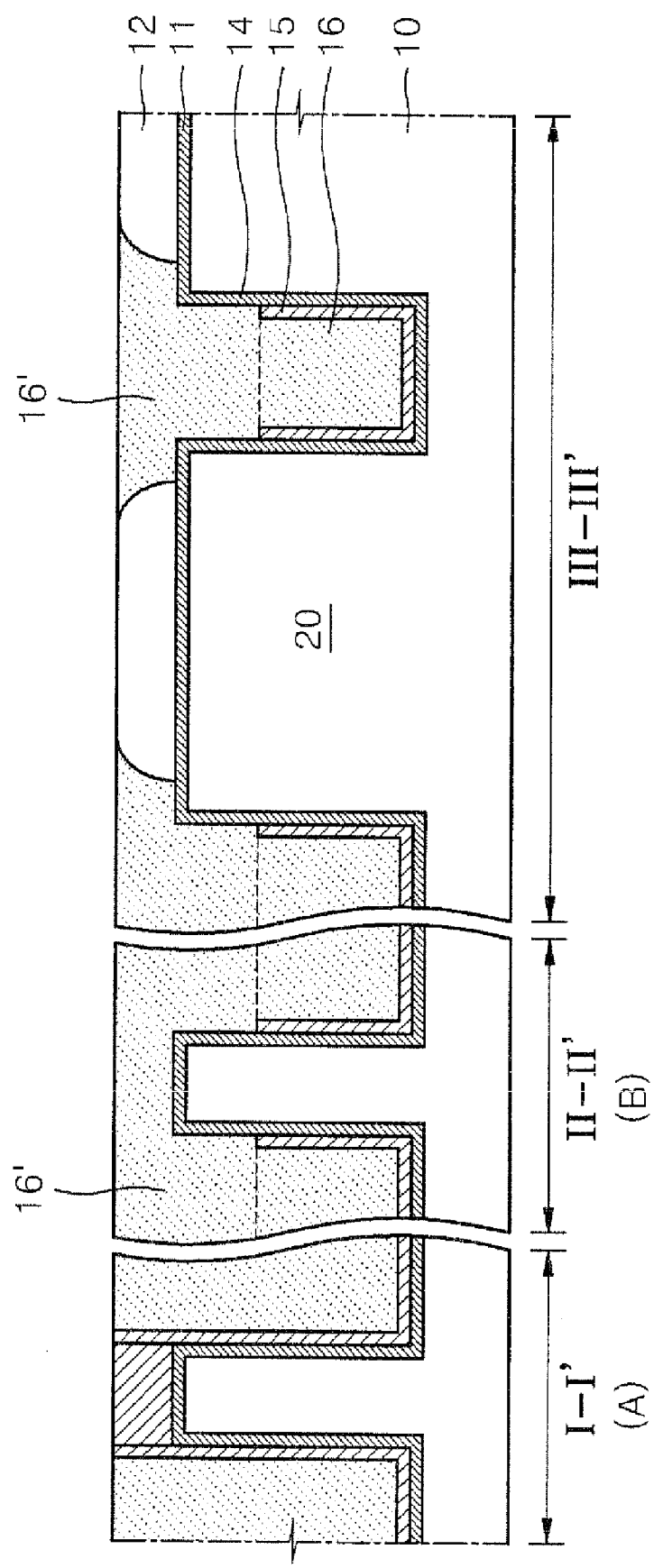

Referring to FIG. 10A, a new isolation oxide layer 16' is formed over the isolation oxide layer 16 and liner nitride layer 15 and is planarized. In one embodiment, the new isolation oxide layer 16' may be planarized by performing a CMP process using the mask nitride layer 12 in the A region (i.e., along line I-I') as a stop layer. As illustrated, the liner nitride layer 15 in the A region (i.e., along line I-I') remains substantially coplanar with the top surface of the semiconductor substrate, but the liner nitride layer 15 in the B region (i.e., along line II-II') is lowered to a depth below the top surface of the semiconductor substrate 10 and is buried by the new isolation oxide layer 16'.

Figure 10B:
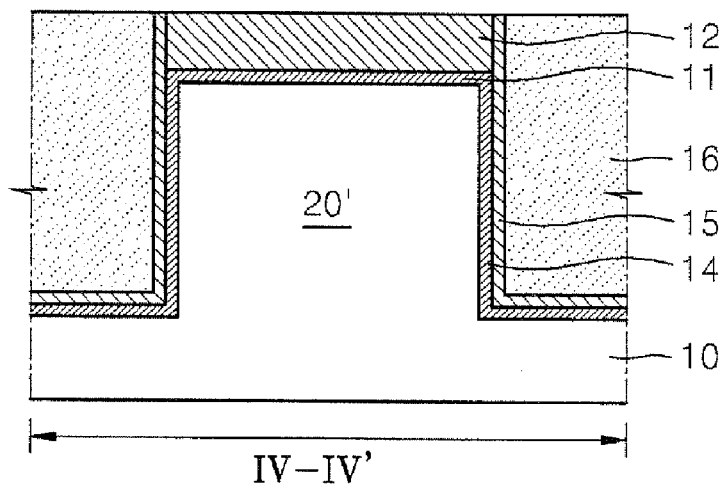
Figure 10C:
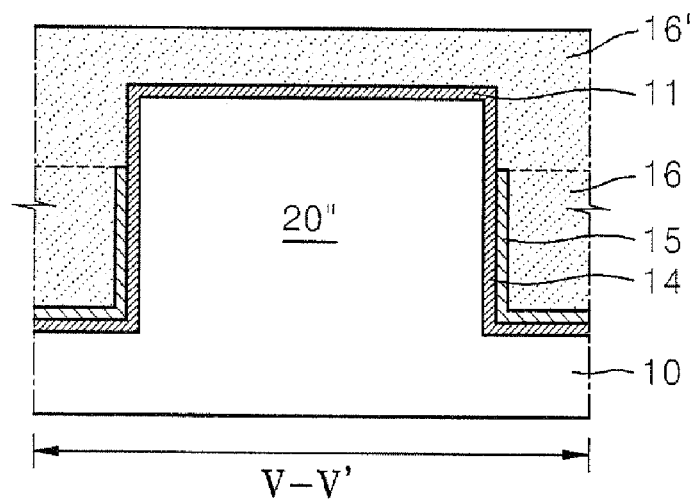

Referring to FIGS. 10B and 10C, the active region 20' in the core region is formed to have a similar sectional construction as the A region (i.e., along line I-I') in the cell region while the active region 20" in the peripheral region is formed to have a similar sectional construction as the B region (i.e., along line II-II') in the cell region. For example, an upper portion of the liner nitride layer 15 in the core region illustrated in FIG. 10B is substantially coplanar with an upper surface of the semiconductor substrate 10 while the upper portion of the liner nitride layer 15 in the peripheral region illustrated in FIG. 10C is below the upper surface of the semiconductor substrate 10 and is buried by the new isolation oxide layer 16'.

Reviewing the processes described above, regions of the semiconductor substrate 10 where fin-shaped and substantially planar active regions are to be formed are divided using photoresist patterns 24, 24', and 24". Based on these divided regions, the upper portion of the liner nitride layer 15 can either be, for example, substantially coplanar with an upper surface of the semiconductor substrate 10 or be below the upper surface of the semiconductor substrate 10, buried by the new isolation oxide layer 16'.

Figure 11A:
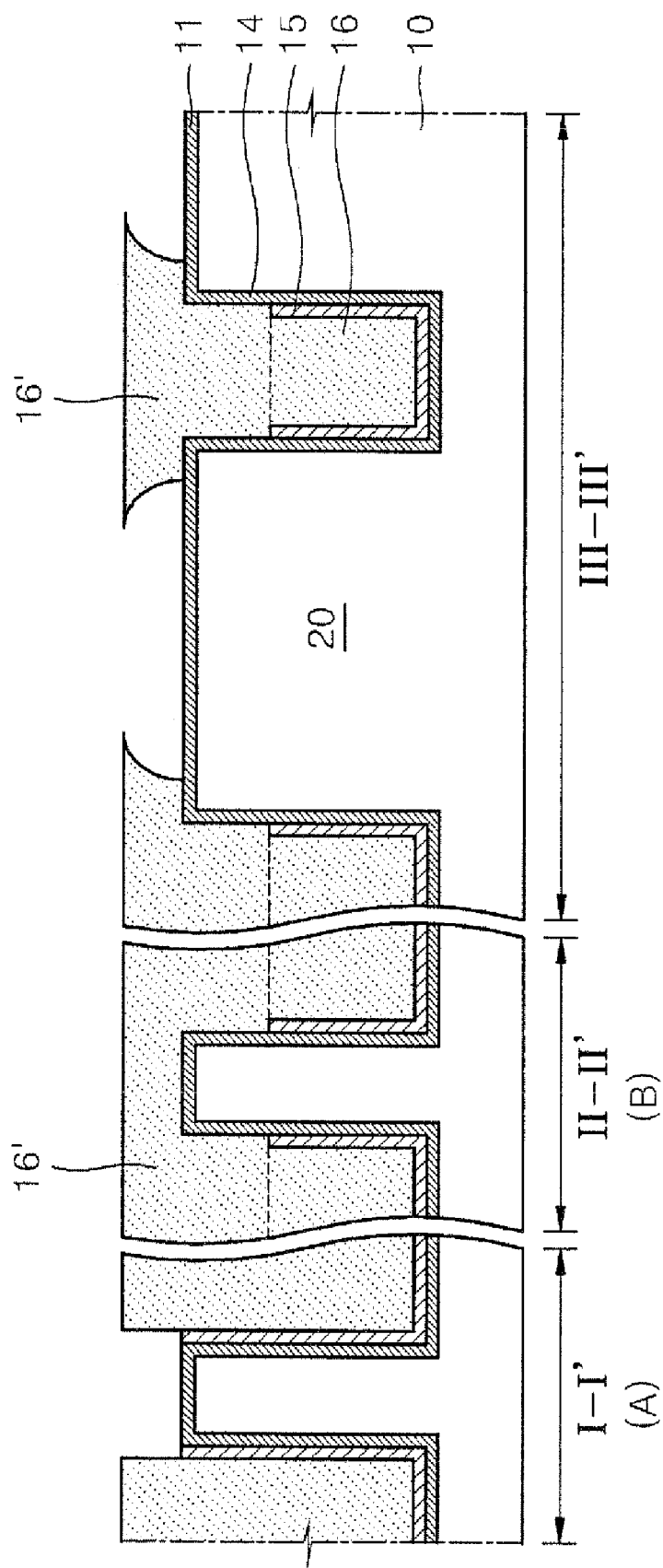
Figure 11B:
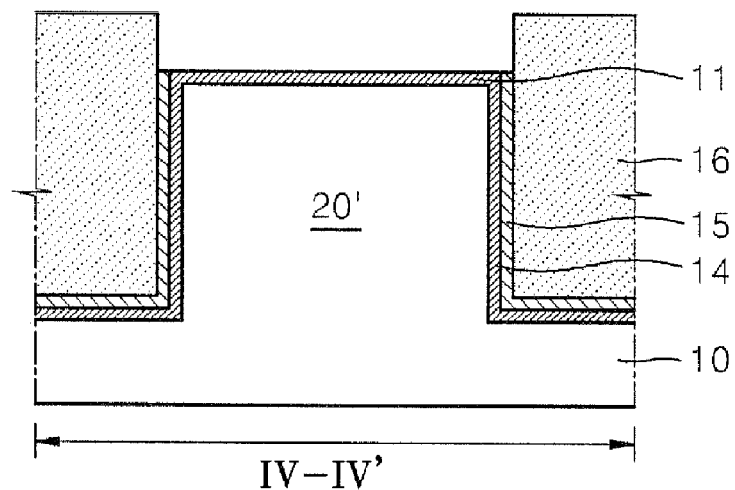
Figure 11C:
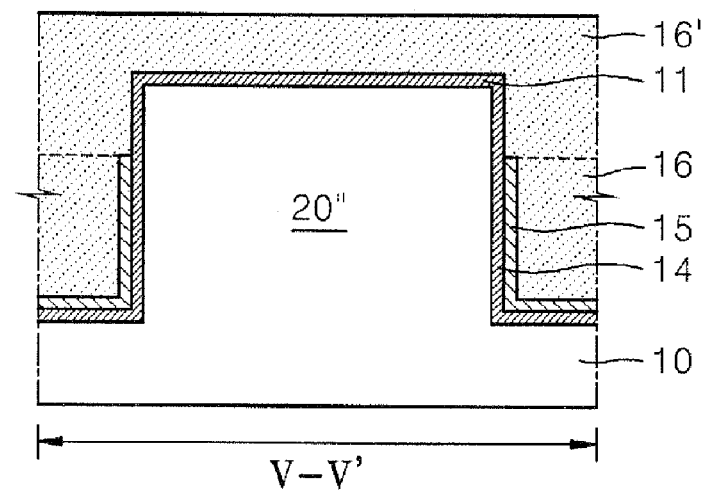

Referring to FIGS. 11A-C, the remaining portions of the mask nitride layer 12 are selectively removed with respect to the isolation oxide layers 16 and 16'. In one embodiment, the mask nitride layer 12 may be selectively removed using a phosphoric acid solution. As illustrated, the liner nitride layer 15 is covered by the isolation oxide layers 16 and 16' so that the liner nitride layer 15 is not etched by the phosphoric acid solution.

Referring to FIGS. 11B and 11C, as described above, the active region 20' in the core region is formed to have a similar sectional construction as the A region (i.e., along line I-I') in the cell region while the active region 20" in the peripheral region is formed to have a similar sectional construction as the B region (i.e., along line II-II') in the cell region. For example, an tipper portion of the liner nitride layer 15 in the core region illustrated in FIG. 11B is substantially coplanar with an upper surface of the semiconductor substrate 10 while the upper portion of the liner nitride layer 15 in the peripheral region illustrated in FIG. 11C is below the upper surface of the semiconductor substrate 10 and is buried by the isolation oxide layer 16'.

Figure 12A:
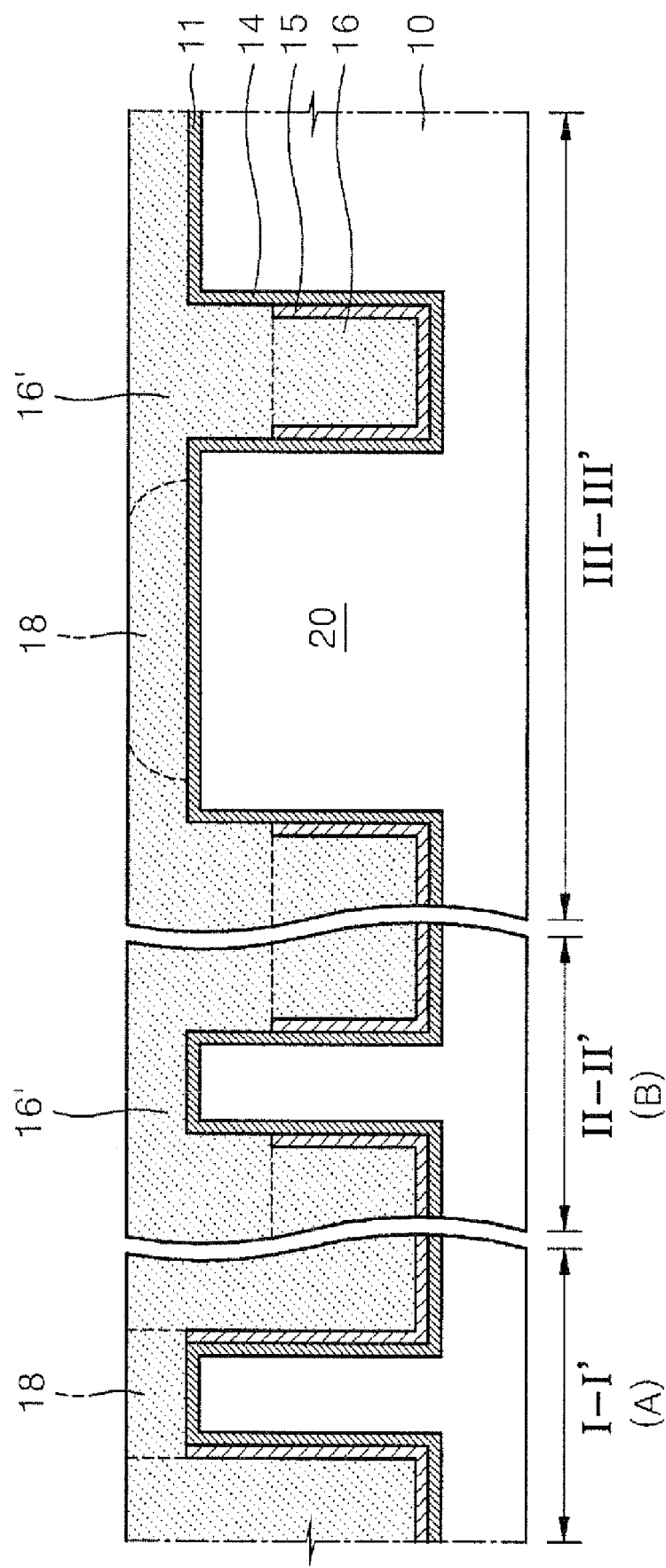
Figure 12B:
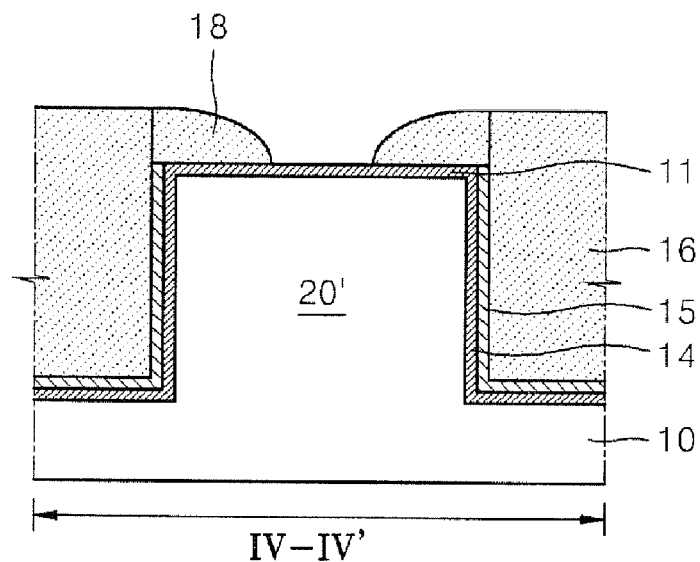
Figure 12C:
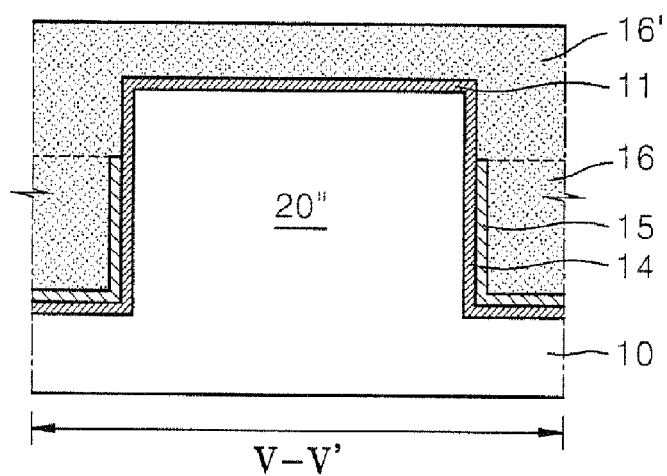

Referring to FIGS. 12A and 12B, an oxide material is formed over the semiconductor substrate 10 and on sidewalls of the isolation oxide layers 16 and 16' in areas where the mask nitride layer 12 has been removed as shown in FIGS. 11A-11C. The oxide material is then partially removed (e.g., in an etch back process). In one embodiment, the oxide material may include a material such as middle temperature oxide (MTO). Since the width of the active region 20 in the cell region is less than that of the active region 20' in the core region, partial removal of the oxide material results in the formation of oxide layer 18 completely burying the area above the upper portion of the active region 20 where the mask nitride layer 12 was removed, as shown FIG. 12A, and also results in the formation of spacers 18' on the sidewall of the isolation oxide layer 16 above the active region 20' in the core region. The spacers 18' may subsequently function as a mask to form a double fin. Referring to FIG. 12C, the sectional construction of the peripheral region is similar to the sectional construction of the B region (i.e., along line II-II') of the cell region illustrated in FIG. 12A. That is, the new isolation oxide layer 16' covers the active region 20" and the liner nitride layer 15 of the peripheral region.

Figure 13A:
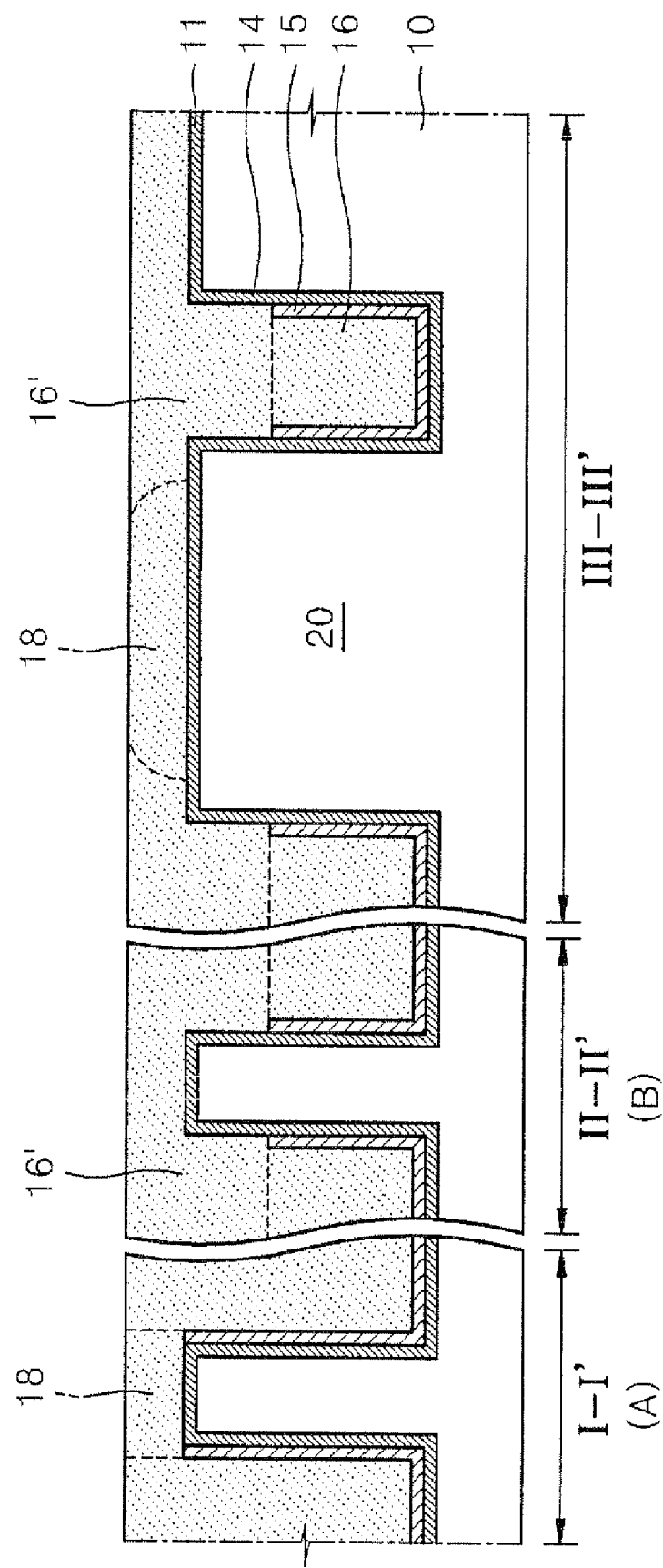
Figure 13B:
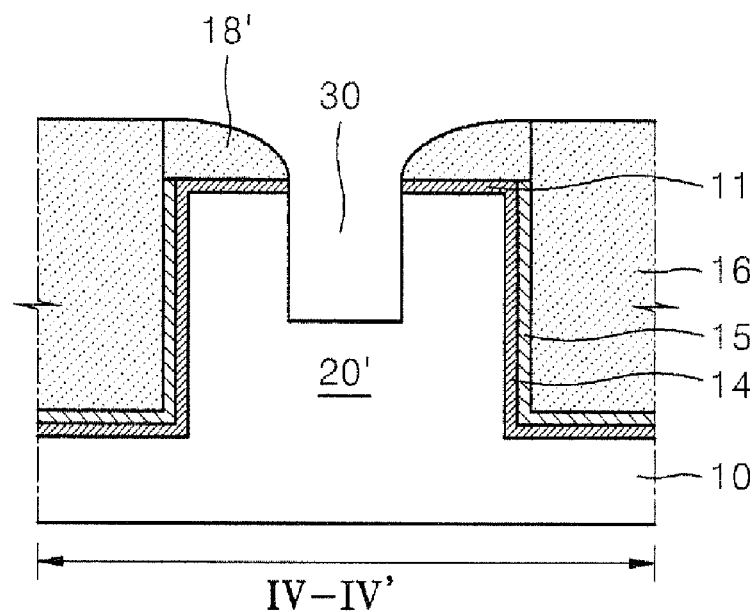
Figure 13C:
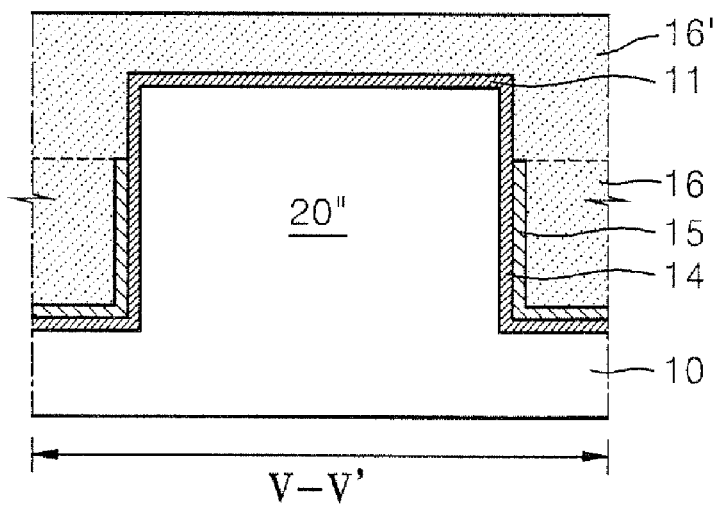

Referring to FIGS. 13A, 13B, and 13C, the semiconductor substrate 10 is etched using the isolation oxide layers 16 and 16', oxide layer 18 and spacers 18', variously formed in the cell, core and peripheral regions, as an etch mask. Accordingly, the active region 20' is etched to form a trench 30. Due to the formation of trench 30, the active region 20' can be formed as a double fin-shaped active region. Since the area of the active region 20' contacting a subsequently formed gate structure increases due to the presence of the trench 30, the double fin-shaped active regions can be more effective in controlling a gate.

Figure 14A:
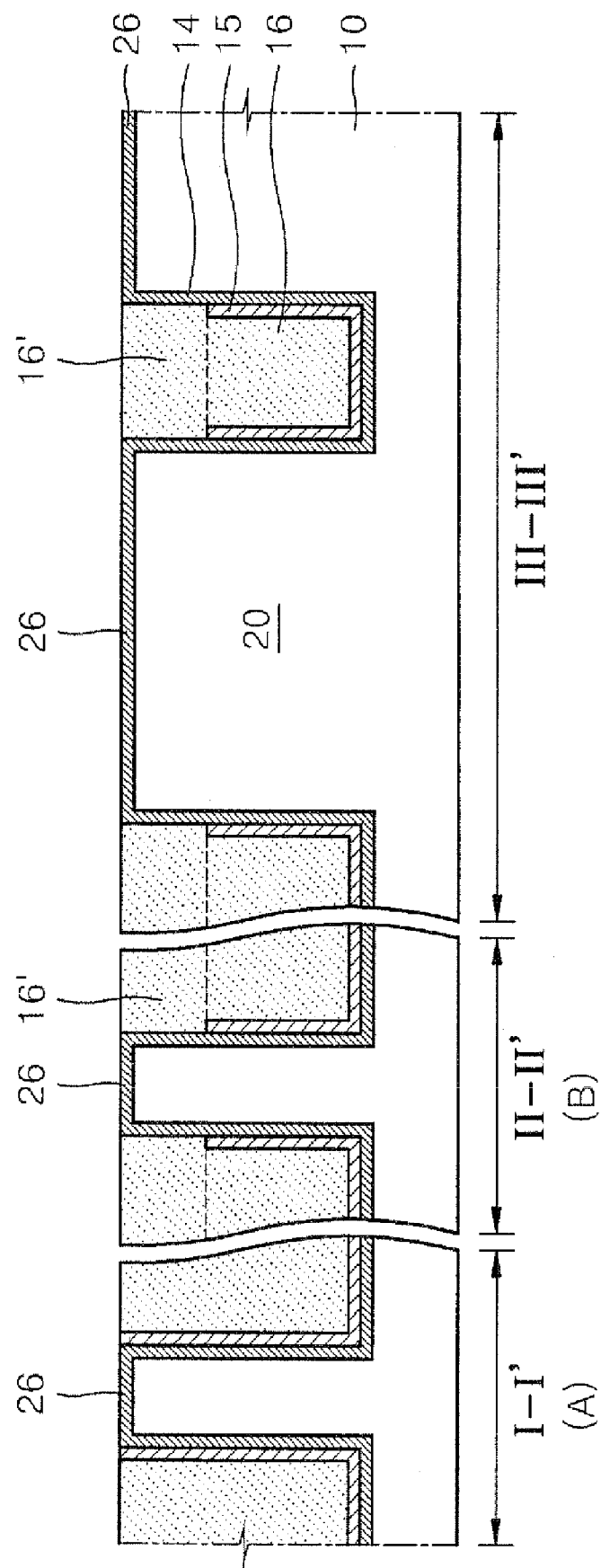
Figure 14B:
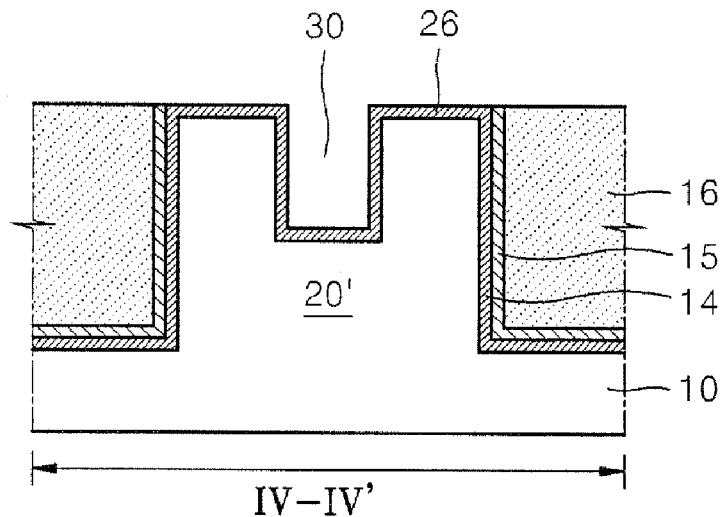
Figure 14C:
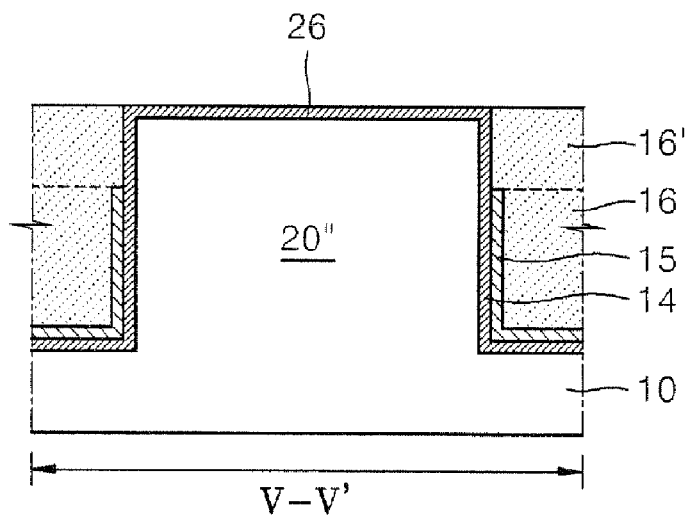

Referring to FIGS. 14A, 14B, and 14C, the isolation oxide layers 16 and 16', oxide layer 18, spacers 18' and pad oxide layer 11 are treated (e.g., wet etched) so as to expose upper surfaces of the active regions 20, 20' and 20". An oxide layer 26 is then formed on the exposed surfaces of the active regions 20, 20' and 20". As illustrated, the upper portions of the liner nitride layer 15 in the A region (i.e., along line I-I') of the cell region, and the core region (i.e., along line IV-IV') where a fin is formed, are exposed by the isolation oxide layer 16 while the upper portions of the liner nitride layer 15 in the peripheral region and in the B region (i.e., along line II-II') of the cell region remain covered by the isolation oxide layer 16'.

Figure 15A:
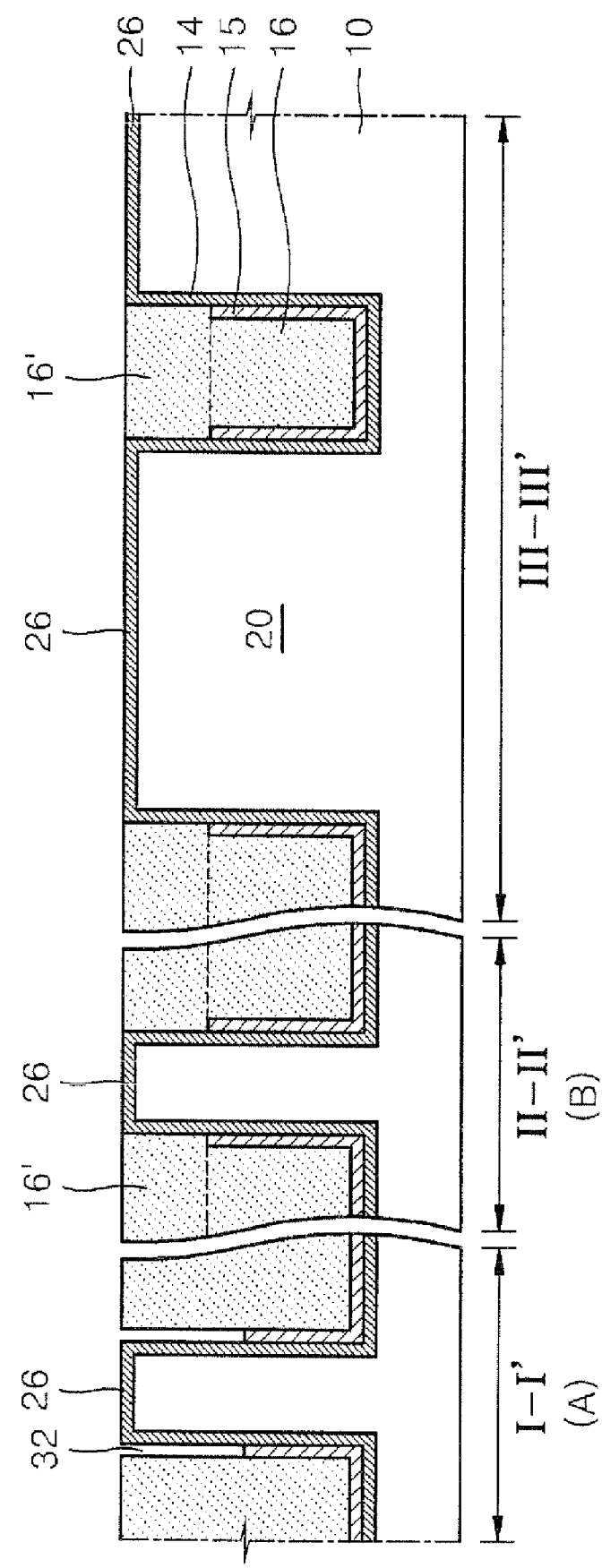
Figure 15B:
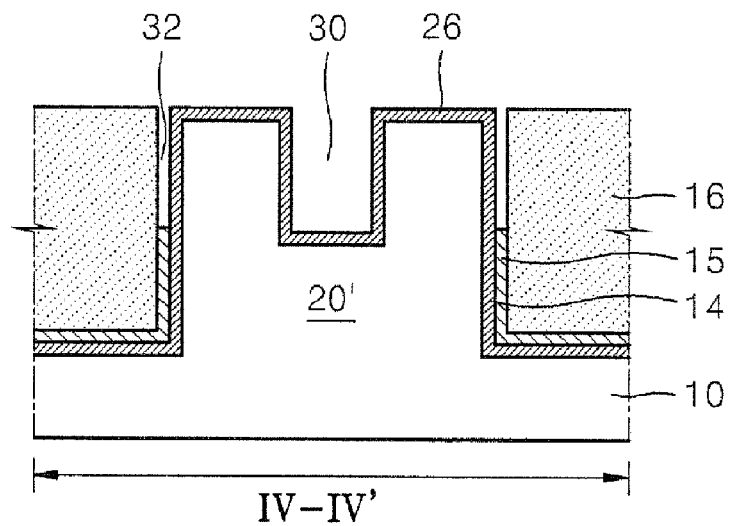
Figure 15C:
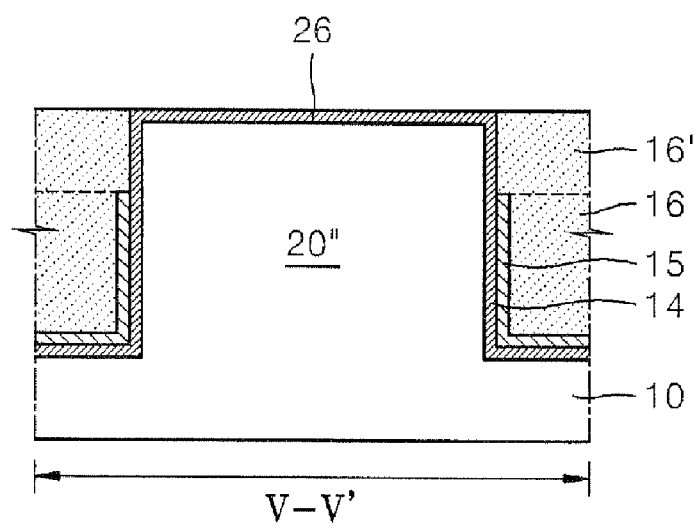

Referring to FIGS. 15A, 15B, and 15C, portions of the liner nitride layer 15 in the cell and core regions that are exposed by the insulation oxide layer 16 are removed to a predetermined depth. In one embodiment, the predetermined depth will correspond to the height of a subsequently formed fin-shaped active region, and may be substantially equal to the depth of the fin formed in the core region. In one embodiment, the liner nitride layer 15 may be selectively removed using a phosphoric acid solution. A space 32 is defined between the liner oxide layer 14 and the isolation oxide layer 16 at regions corresponding to where portions of the liner nitride layer 15 was removed. Since the liner nitride layer 15 is not exposed in the peripheral region and in the B region of the cell region, the liner nitride layer 15 remains between liner oxide layer 14 and the isolation oxide layer 16.

Figure 16A:
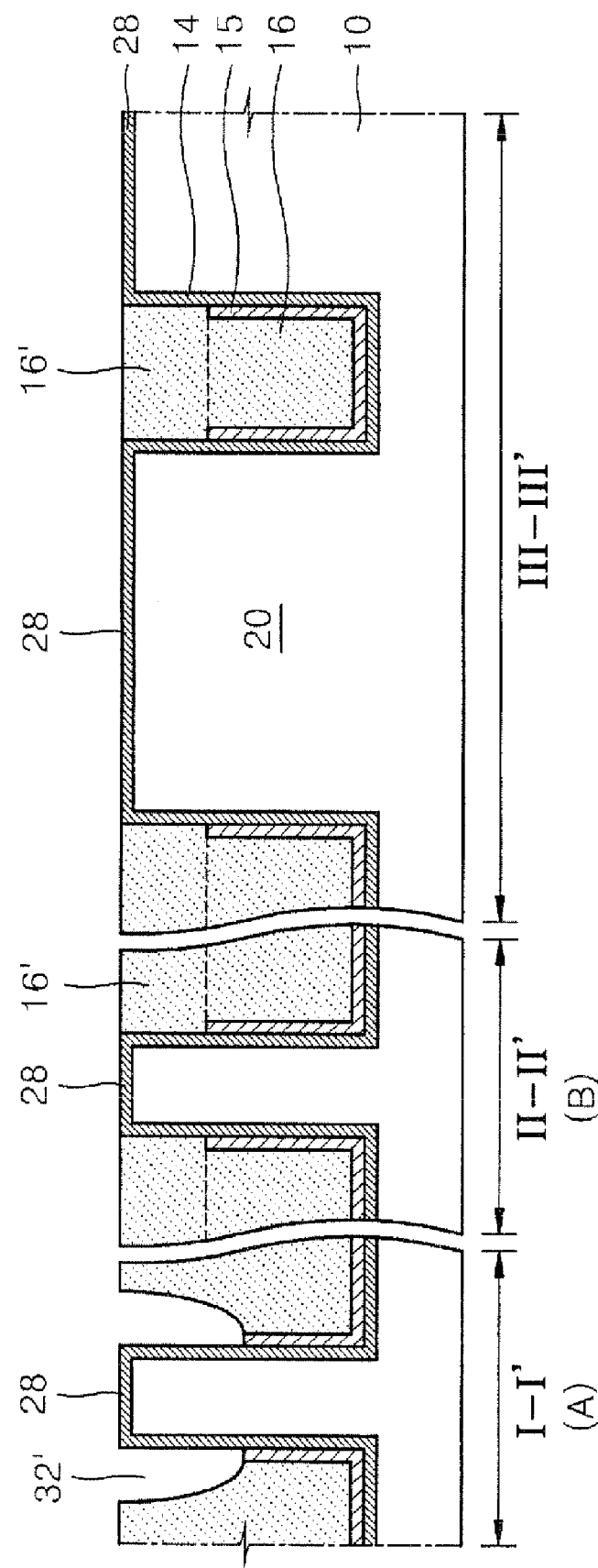
Figure 16B:
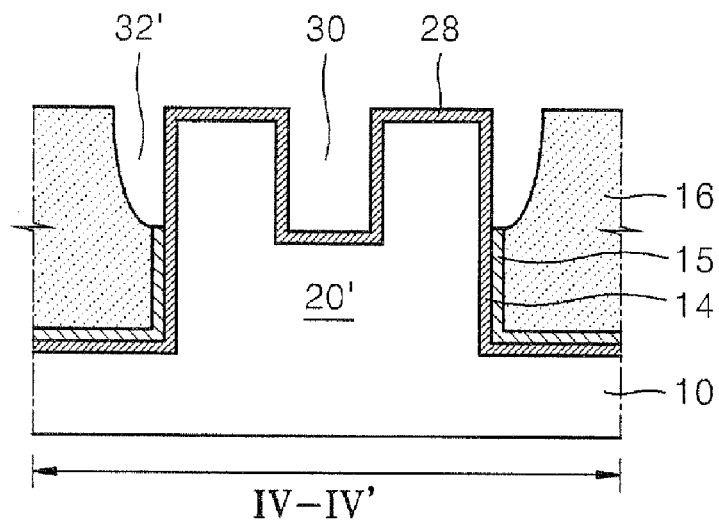
Figure 16C:
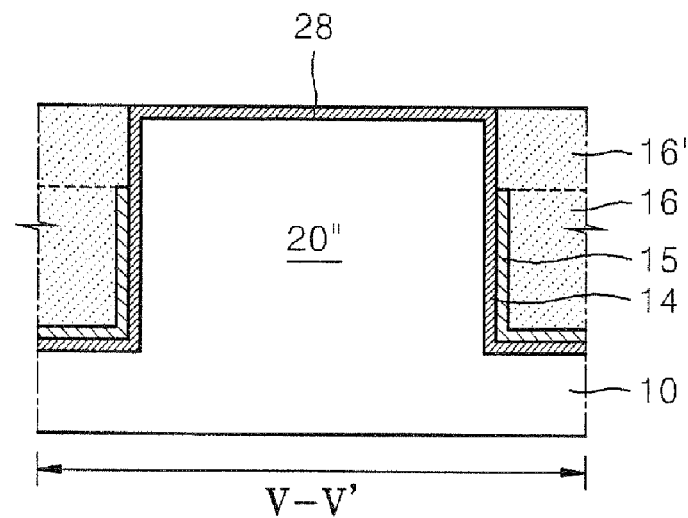

Referring to FIGS. 16A, 16B and 16C, exposed portions of the liner oxide layer 14, oxide layer 26 and isolation oxide layer 16 may be treated (e.g., in a wet etch process using HF solution). As a result of the treatment, the liner oxide layer 14 and isolation oxide layer 16 may be partially removed while the oxide layer 26 may be completely removed. After treating the liner oxide layer 14, oxide layer 26 and isolation oxide layer 16, a gate oxide layer 28 may be formed. In one embodiment, the isolation oxide layer 16 may be partially removed to increase the distance of an inner sidewall surface of the isolation oxide layer 16 from a sidewall surface of the adjacent active regions 20 and 20', thereby forming an extended space 32'. As exemplarily shown in FIG. 16A, the extended space 32' allows sidewall surfaces of the active region 20 in the A region (i.e., along line I-I') of the cell region to be in electrical communication with a subsequently formed gate structure, thereby forming a fin-shaped active region 20 in the A region (i.e., along line I-I'). As also shown in FIG. 16A, an upper surface of the isolation oxide layer 16 in the B region (i.e., along line II-II') of the cell region is maintained to be substantially coplanar with the active region 20 adjacent thereto, thereby creating a substantially planar active region in the B region (i.e., along line II-II'). Similarly, as shown in FIG. 16C, the upper surface of the isolation oxide layer 16' in the peripheral region is substantially coplanar with the active region 20" adjacent thereto, thereby creating a substantially planar active region.

Reviewing the processes exemplarily described above, upper portions of the liner nitride layer 15 adjacent to active regions which are to be formed as substantially planar active regions are exposed by photoresist patterns 24, 24', and 24", removed, and buried with isolation oxide layer 16' so as to be protected from subsequent processing steps. As a result, a substantially planar surface can be defined as contiguously extending from the isolation oxide layer 16' to an upper surface of an adjacent active region. Upper portions of the liner nitride layer 15 adjacent to active regions which are to be formed as fin-shaped active regions are exposed after the photoresist patterns 24, 24', and 24" have been removed and, subsequently, a space between such active regions and the isolation oxide layer 16 is extended (e.g., enlarged). Moreover, a trench 30 may be formed in an active region formed in the core region, thereby forming a double fin-shaped active region.

Figure 17A:
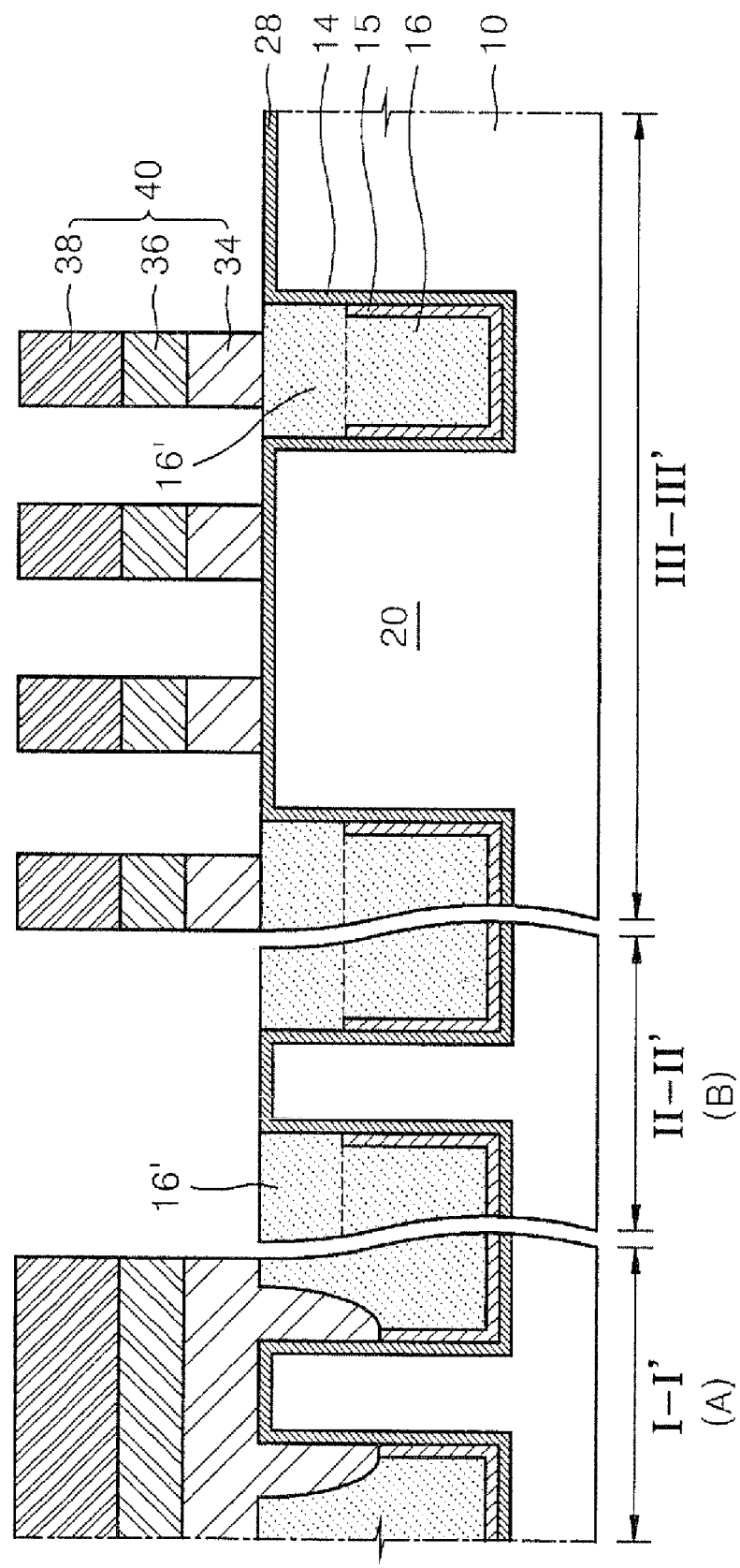
Figure 17B:
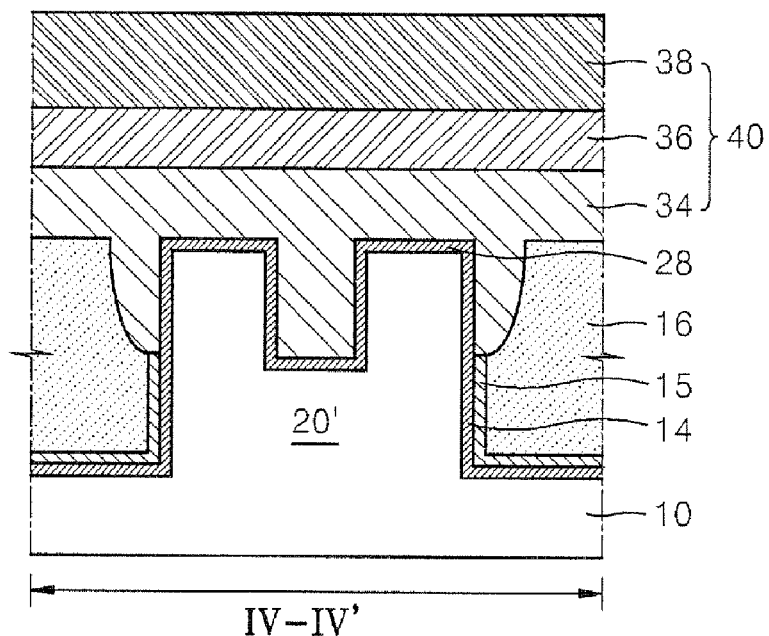
Figure 17C:
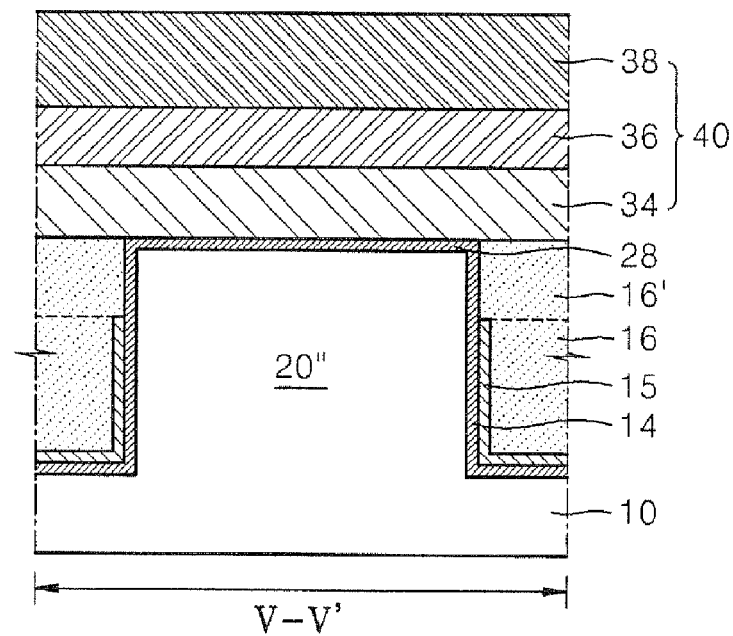

Referring to FIGS. 17A, 17B, and 17C, a polysilicon layer 34 is formed on the semiconductor substrate 10 to fill the extended spaces 32'. A tungsten silicide layer 36 is formed on the polysilicon layer 34 and a capping nitride layer 38 is formed on the tungsten silicide layer 36. The resulting stack of layers may be patterned to form a plurality of gate structures 40. In one embodiment, the gate structure 40 in the core region and the peripheral region may be different than the gate structure 40 in a stack structure in the cell region.

In the cell region formed as described above, one portion of the active region 20 (e.g., in the A region along line I-I') is a fin-shaped active region and another portion of the active region 20 (e.g., in the B region along line II-II') is a substantially planar active region. Accordingly, if a portion of a gate structure extends over the isolation region 22 and over the A region of a first active region 20 and another portion of the gate structure extends over the B region of a second active region 20 adjacent to the first active region, the degree to which signals transmitted by gate structure influence the second active region will be minimized.

As exemplarily described above, the aforementioned photoresist pattern protects a portion of the cell region of the substrate (i.e., the A region) where a fin-shaped active region is to be formed and exposes a portion of the cell region of the substrate (i.e., the B region) where a substantially planar active region is to be formed. The liner nitride layer between the active region protected by the photoresist pattern and the isolation region is then exposed from the top surface of the semiconductor substrate, removed to a predetermined depth and replaced by an isolation oxide layer. The depth to which the liner nitride layer is removed may correspond to the height of a fin-shaped active region that is to be subsequently formed and portions of the isolation oxide layer adjacent to the active region are removed laterally so as to form the fin-shaped active region. Since the isolation oxide layer is not removed laterally in the portion of the liner nitride layer buried by the isolation oxide layer, a substantially planar active region can also be formed.

As described above, an active region having both a fin-shaped portion and a substantially planar portion (i.e., a modified FinFET) can be formed in the cell region while a double FinFET and a substantially planar MOSFET can also be concurrently formed in the core and peripheral regions, respectively. During the process of filling the portion from which the mask nitride layer is removed in the core region with the oxide layer, a spacer is formed on the sidewall of the isolation oxide layer, and using the spacer as a mask, the semiconductor substrate is etched, so as to form a double FinFET.

As described above, a FinFET capable of reducing the influence between adjacent gate lines is formed in a cell region, a double FinFET is formed in a core region, and a substantially planar MOSFET is formed in a peripheral region, using one photoresist pattern.

While numerous embodiments have been described above, one exemplary embodiment can be generally characterized as a semiconductor device that includes a substrate having an isolation layer defining active regions; a cell region having a first active region, at least one surface of which is covered by a gate structure filling a portion from which the isolation layer is partially removed; a core region having a second active region, an upper surface of which is separated, and at least one surface including the separated upper surface being covered by a gate structure filled in a portion from which the isolation layer is removed; and a peripheral region having a third active region, in which a gate structure is disposed on an upper surface.

The gate structure in the cell region may be disposed to surround an upper surface and a sidewall of the first active region, and the gate structure between the first active regions may be disposed on the isolation layer.

When the gate structure in the cell region is misaligned, and passes through an edge of the adjacent first active region, the gate structure may be disposed to pass through an upper surface of the first active region not to surround the sidewall of the first active region.

A trench may be formed in the second active region in the core region so that an upper surface of the second active region is separated, and the gate structure may surround an upper surface and a sidewall of the second active region including a sidewall and a lower surface of the trench.

The gate structure in the peripheral region may pass an upper surface of the third active region.

Another exemplary embodiment can be generally characterized as a method of fabricating a semiconductor device that includes forming an isolation layer defining active regions in a substrate; forming a cell region, in which at least one surface of a first active region, a sidewall of which is partially exposed after a portion of the isolation layer is removed, is covered by a gate structure; forming a core region, in which at least on surface including an upper surface of a second active region, a sidewall of which is partially exposed, after the upper surface is separated and a portion of the isolation layer is removed, is covered by a gate structure; and forming a peripheral region, in which a gate structure is disposed on an upper surface of a third active region, wherein the cell region, the core region, and the peripheral region are formed concurrently.

The isolation layer on the substrate may be formed by forming an isolation trench on the substrate having a mask nitride layer formed thereon; forming a liner nitride layer on a sidewall of the trench; forming a first oxide layer to bury the trench on the substrate having the liner nitride layer formed thereon; and performing a chemical mechanical polishing (CMP) process on the first oxide layer to planarize, using the mask nitride layer as a stop layer.

Further, comprise a pad oxide layer may be formed between the substrate and the mask nitride layer. The method may further comprise forming a liner oxide layer between a sidewall of the trench and the liner nitride layer.

The cell region, the core region, and the peripheral region may be formed concurrently by forming a photoresist pattern on the substrate having the isolation layer formed therein; removing portions of the first oxide layer and the mask nitride layer at the region exposed by the photoresist pattern; removing substantially the entire mask nitride layer, a portion of which is removed, and a portion of the exposed liner nitride layer; and forming a second oxide layer to bury a space from which the first oxide layer and the liner nitride layer are removed.

The photoresist pattern may expose an edge region of the first active region, and an isolation region between the edge regions in the cell region. The photoresist pattern may cover the second active region for the upper surface to be separated, and an isolation region adjacent to the second active region in the core region. The photoresist pattern may expose substantially the entire third active region in the peripheral region.

The method may further comprise removing the photoresist pattern after removing portions of the first oxide layer and the mask nitride layer, before removing substantially the entire mask nitride layer, a portion of which is removed, and a portion of the exposed liner nitride layer.

The method may further comprise planarizing the second oxide layer by performing a chemical mechanical polishing (CMP) process, using the mask nitride layer remained after forming the second oxide layer as a stop layer.

The cell region, the core region, and the peripheral region may be concurrently formed by removing the mask nitride layer remained after forming the second oxide layer; and forming a third oxide layer after removing the mask nitride layer. In this case, the mask nitride layer may be completely removed depending on applications.

The third oxide layer may comprise burying a portion from which the mask nitride layer is removed in the cell region; and forming a third oxide layer to form a spacer on a sidewall of the first oxide layer in a portion from which the mask nitride layer is removed in the core region.

The cell region, the core region, and the peripheral region may be concurrently formed by selectively etching the semiconductor substrate exposed between the spacer in the core region after forming the third oxide layer.

The cell region, the core region, and the peripheral region may be concurrently formed by performing etch-back on the first, second, and third oxide layers to expose an upper surface of the semiconductor substrate after selectively etching the substrate; removing a portion of the liner nitride layer exposed on an upper surface of the substrate by the etch-back; and performing a wet-etch process of an oxide layer at a space from which the liner nitride layer is removed, so as to extend the space with a predetermined width.

The cell region, the core region, and the peripheral region may be concurrently formed by forming a conductive layer on the substrate to bury the extended space after removing the liner nitride layer; and patterning the conductive layer in order to form a gate structure.

The conductive layer may be composed of any one of polysilicon, tungsten silicide and tungsten, or a combination thereof.

The first and second oxide layers may be formed by high density plasma chemical vapor deposition (HDP-CVD), and the third oxide layer may be formed of an MTO oxide layer.

Further, mask nitride layer and the liner nitride layer may be removed using a phosphoric acid solution.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a substrate comprising a first device region and a second device region;
   an isolation structure within the substrate, wherein the isolation structure comprises an isolation trench within the substrate, a first insulation layer on a bottom and a sidewall of the isolation trench and a second insulation layer on the first insulation layer and filling the isolation trench;
   a first active region within the first device region and a second active region within the second device region, wherein the first and second active regions are defined by the isolation structure; and
   a plurality of gate structures extending over the first and second active regions and the isolation structure in the first and second device regions,
   wherein a first portion of the first active region is a fin-shaped active region and the second active region is a substantially planar active region,
   wherein an uppermost portion of the first insulation layer within the isolation trench is lower than an uppermost portion of the second insulation layer within the isolation trench in the first device region and in the second device region, and wherein upper surfaces of the first and second active regions are substantially coplanar with an upper surface of the isolation structure.

2. The semiconductor device of claim 1, wherein a portion of one of the plurality of gate structures is disposed between the isolation structure and the first active region.

3. The semiconductor device of claim 1, wherein a second portion of the first active region is a substantially planar active region.

4. The semiconductor device of claim 1, wherein the substrate further comprises a third device region and the isolation structure defines a third active region in the third device region and wherein a recess is formed within the upper surface of the substrate in the third active region so that the third active region is a double fin-shaped active region.

5. A method of fabricating a semiconductor device, the method comprising:

providing a substrate having a first device region and a second device region;

forming an isolation structure within the substrate, wherein the isolation structure comprises an isolation trench within the substrate, a first insulation material on a bottom and a sidewall of the isolation trench and a second insulation material on the first insulation material and filling the isolation trench;

forming a first active region within the first device region and a second active region within the second device region, wherein the first and second active regions are defined by the isolation structure; and forming a plurality of gate structures extending over the first and second active regions and the isolation structure in the first and second device regions, wherein a first portion of the first active region is a fin-shaped active region and the second active region is a substantially planar active region, wherein an uppermost portion of the first insulation material within the isolation trench is lower than an uppermost portion of the second insulation material within the isolation trench in the first device region and in the second device region, and wherein upper surfaces of the first and second active regions are substantially coplanar with an upper surface of the isolation structure.

6. The method of claim 5, wherein forming the isolation structure comprises:

forming the isolation trench within the substrate;

forming the first insulation material within the isolation trench; and forming the second insulation material within the trench above the first insulation material and over an upper surface of the substrate, wherein a thickness of the second insulation material above the first insulation material in the first device region is less than a thickness of the second insulation material above the first insulation material in the second device region.

7. The method of claim 6, wherein forming the first and second active regions comprises:

removing the second insulation material in the first and second device regions such that the first insulation material in the first device region is exposed by the second insulation material and the first insulation material in the second device region is covered by the second insulation material;

removing the first insulation material exposed in the first device region, thereby creating a space having a width between the substrate and the second insulation material; and removing the second insulation material exposed to the space, thereby extending the width of the space.

8. The method of claim 5, wherein the substrate further includes a third device region, the method further comprising:

forming a third active region within the third device region, the third active region defined by the isolation structure, wherein a recess is formed within an upper surface of the substrate in the third active region so that the third active region is a double fin-shaped active region.

9. The method of claim 8, wherein forming the isolation structure comprises:

forming a mask nitride layer on the substrate;

forming an isolation trench within the substrate using the mask nitride layer as a mask;

forming an isolation oxide material within the trench and over the mask nitride layer, wherein an upper surface of the isolation oxide material is above an upper surface of the substrate and wherein the mask nitride layer is exposed by the isolation oxide material.

10. The method of claim 9, wherein forming the first active region comprises:

removing the mask nitride layer exposed by the isolation oxide material, thereby defining a first recess within the isolation oxide material in the first device region and a second recess within the isolation oxide material in the second device region;

burying the first recess with a mask material and forming spacers of the mask material within the second recess; and removing a portion of the substrate below the second recess using the spacers as a mask, thereby forming a trench within the upper surface of the substrate in the second device region.

11. A method of fabricating a semiconductor device, the method comprising:

providing a substrate having a first device region and a second device region;

forming an isolation structure within the substrate, wherein the isolation structure comprises an isolation trench within the substrate, a first insulation material on a bottom and a sidewall of the isolation trench and a second insulation material on the first insulation material and filling the isolation trench, wherein an uppermost portion of the first insulation material within the isolation trench is lower than an uppermost portion of the second insulation material within the isolation trench in the first device region and in the second device region, and wherein a portion of the isolation structure in the first device region has a first arrangement of insulation material and a portion of the isolation structure in the second device region has a second arrangement of insulation material different from the first arrangement of insulation material;

subjecting the portions of the isolation structure within the first and second device regions to substantially the same etching conditions to form a first active region within the first device region and a second active region within the second device region, wherein the first and second active regions are defined by the isolation structure, wherein a first portion of the first active region is a fin-shaped active region and the second active region is a substantially planar active region.

12. The method of claim 11, wherein the substrate further includes a third device region, the method further comprising:
defining a third active region within a portion of the isolation structure in the third device region; and
forming a recess within an upper surface of the substrate in the third active region.

13. The method of claim 12, further comprising forming the recess before formation of the isolation structure.

* * * * *